US008952832B2

(12) United States Patent
Nasiri et al.

(10) Patent No.: US 8,952,832 B2
(45) Date of Patent: Feb. 10, 2015

(54) INTERFACING APPLICATION PROGRAMS AND MOTION SENSORS OF A DEVICE

(75) Inventors: Steven S. Nasiri, Saratoga, CA (US); Joseph Jiang, Sunnyvale, CA (US); David Sachs, Sunnyvale, CA (US)

(73) Assignee: Invensense, Inc., San Jose, CA (US)

( * ) Notice: Subject to any disclaimer, the term of this patent is extended or adjusted under 35 U.S.C. 154(b) by 1387 days.

(21) Appl. No.: 12/106,921

(22) Filed: Apr. 21, 2008

(65) Prior Publication Data

US 2009/0184849 A1   Jul. 23, 2009

Related U.S. Application Data

(60) Provisional application No. 61/022,143, filed on Jan. 18, 2008.

(51) Int. Cl.

| H03M 11/00 | (2006.01) |
| G06F 3/038 | (2013.01) |
| G06F 3/0346 | (2013.01) |
| G06F 3/01 | (2006.01) |

(52) U.S. Cl.
CPC ............ *G06F 3/038* (2013.01); *A63F 2300/209* (2013.01); *A63F 2300/105* (2013.01); *G06F 3/0346* (2013.01); *G06F 3/017* (2013.01)
USPC .............................. 341/20; 702/141; 700/302

(58) Field of Classification Search
USPC .................. 341/20–22; 340/995.17; 702/141, 702/150–154; 73/504.02–504.03, 504.08; 700/302–303
See application file for complete search history.

(56) References Cited

U.S. PATENT DOCUMENTS

| 4,303,978 A | 12/1981 | Shaw et al. |
| 4,510,802 A | 4/1985 | Peters |
| 4,601,206 A | 7/1986 | Watson |
| 4,736,629 A | 4/1988 | Cole |

(Continued)

FOREIGN PATENT DOCUMENTS

| CN | 1722063 A | 1/2006 |
| CN | 1853158 A | 10/2006 |

(Continued)

OTHER PUBLICATIONS

Oboe, R., Lasalandra, E., White, M. M. MEMS-based Accelerometers and their Application to Vibration Suppression in Hard Disk Drives. MEMS/NEMS Handbook Techniques and Applications vol. 4, Springer 2006, pp. 1-29 see pp. 7-22.

(Continued)

*Primary Examiner* — Albert Wong
(74) *Attorney, Agent, or Firm* — Sawyer Law Group, P.C.

(57) ABSTRACT

Interfacing application programs and motion sensors of a device. In one aspect, a high-level command is received from an application program running on a motion sensing device, where the application program implements one of multiple different types of applications available for use on the device. The high-level command requests high-level information derived from the output of motion sensors of the device that include rotational motion sensors and linear motion sensors. The command is translated to cause low-level processing of motion sensor data output by the motion sensors, the low-level processing following requirements of the type of application and determining the high-level information in response to the command. The application program is ignorant of the low-level processing, and the high-level information is provided to the application program.

28 Claims, 9 Drawing Sheets

(56) References Cited

U.S. PATENT DOCUMENTS

| | | |
|---|---|---|
| 4,783,742 A | 11/1988 | Peters |
| 4,841,773 A | 6/1989 | Stewart |
| 5,083,466 A | 1/1992 | Holm-Kennedy et al. |
| 5,128,671 A | 7/1992 | Thomas, Jr. |
| 5,251,484 A | 10/1993 | Mastache |
| 5,313,835 A | 5/1994 | Dunn |
| 5,349,858 A | 9/1994 | Yagi et al. |
| 5,359,893 A | 11/1994 | Dunn |
| 5,367,631 A | 11/1994 | Levy |
| 5,392,650 A | 2/1995 | O'Brien et al. |
| 5,396,797 A | 3/1995 | Hulsing, II |
| 5,415,040 A | 5/1995 | Nottmeyer |
| 5,415,060 A | 5/1995 | DeStefano, Jr. |
| 5,433,110 A | 7/1995 | Gertz et al. |
| 5,440,326 A | 8/1995 | Quinn |
| 5,444,639 A | 8/1995 | White |
| 5,511,419 A | 4/1996 | Dunn |
| 5,541,860 A | 7/1996 | Takei et al. |
| 5,574,221 A | 11/1996 | Park et al. |
| 5,581,484 A | 12/1996 | Prince |
| 5,629,988 A | 5/1997 | Burt et al. |
| 5,635,638 A | 6/1997 | Geen |
| 5,635,639 A | 6/1997 | Greiff et al. |
| 5,698,784 A | 12/1997 | Hotelling et al. |
| 5,703,293 A | 12/1997 | Zabler et al. |
| 5,703,623 A | 12/1997 | Hall et al. |
| 5,723,790 A | 3/1998 | Andersson |
| 5,734,373 A | 3/1998 | Rosenberg et al. |
| 5,780,740 A | 7/1998 | Lee et al. |
| 5,817,942 A | 10/1998 | Greiff |
| 5,825,350 A | 10/1998 | Case, Jr. et al. |
| 5,831,162 A | 11/1998 | Sparks et al. |
| 5,868,031 A | 2/1999 | Kokush et al. |
| 5,895,850 A | 4/1999 | Buestgens |
| 5,898,421 A | 4/1999 | Quinn |
| 5,955,668 A | 9/1999 | Hsu et al. |
| 5,959,209 A | 9/1999 | Takeuchi et al. |
| 5,992,233 A | 11/1999 | Clark |
| 5,996,409 A | 12/1999 | Funk et al. |
| 6,018,998 A | 2/2000 | Zunino et al. |
| 6,060,336 A | 5/2000 | Wan |
| 6,067,858 A | 5/2000 | Clark et al. |
| 6,082,197 A | 7/2000 | Mizuno et al. |
| 6,122,195 A | 9/2000 | Estakhri et al. |
| 6,122,961 A | 9/2000 | Geen et al. |
| 6,122,965 A | 9/2000 | Seidel et al. |
| 6,134,961 A | 10/2000 | Touge et al. |
| 6,158,280 A | 12/2000 | Nonomura et al. |
| 6,159,761 A | 12/2000 | Okada |
| 6,167,757 B1 | 1/2001 | Yazdi et al. |
| 6,168,965 B1 | 1/2001 | Malinovich et al. |
| 6,189,381 B1 | 2/2001 | Huang et al. |
| 6,192,756 B1 | 2/2001 | Kikuchi et al. |
| 6,230,564 B1 | 5/2001 | Matsunaga et al. |
| 6,250,156 B1 | 6/2001 | Seshia et al. |
| 6,250,157 B1 | 6/2001 | Touge |
| 6,257,059 B1 | 7/2001 | Weinberg et al. |
| 6,269,254 B1 | 7/2001 | Mathis |
| 6,279,043 B1 | 8/2001 | Hayward et al. |
| 6,292,170 B1 | 9/2001 | Chang et al. |
| 6,343,349 B1 | 1/2002 | Braun et al. |
| 6,370,937 B2 | 4/2002 | Hsu |
| 6,374,255 B1 | 4/2002 | Peurach et al. |
| 6,386,033 B1 | 5/2002 | Negoro |
| 6,391,673 B1 | 5/2002 | Ha et al. |
| 6,393,914 B1 | 5/2002 | Zarabadi et al. |
| 6,424,356 B2 | 7/2002 | Chang et al. |
| 6,429,895 B1 | 8/2002 | Onuki |
| 6,430,998 B2 | 8/2002 | Kawai et al. |
| 6,456,939 B1 | 9/2002 | McCall et al. |
| 6,480,320 B2 | 11/2002 | Nasiri |
| 6,481,283 B1 | 11/2002 | Cardarelli |
| 6,481,284 B2 | 11/2002 | Geen et al. |
| 6,481,285 B1 | 11/2002 | Shkel et al. |
| 6,487,369 B1 | 11/2002 | Sato |
| 6,487,908 B2 | 12/2002 | Geen et al. |
| 6,494,096 B2 | 12/2002 | Sakai et al. |
| 6,508,122 B1 | 1/2003 | McCall et al. |
| 6,508,125 B2 | 1/2003 | Otani |
| 6,512,478 B1 | 1/2003 | Chien |
| 6,513,380 B2 | 2/2003 | Reeds, III et al. |
| 6,520,017 B1 | 2/2003 | Schoefthaler et al. |
| 6,533,947 B2 | 3/2003 | Nasiri et al. |
| 6,538,296 B1 | 3/2003 | Wan |
| 6,573,883 B1 | 6/2003 | Bartlett |
| 6,603,420 B1 | 8/2003 | Lu |
| 6,636,521 B1 | 10/2003 | Giulianelli |
| 6,646,289 B1 | 11/2003 | Badehi |
| 6,647,352 B1 | 11/2003 | Horton |
| 6,666,092 B2 | 12/2003 | Zarabadi et al. |
| 6,668,614 B2 | 12/2003 | Itakura |
| 6,671,648 B2 | 12/2003 | McCall et al. |
| 6,718,823 B2 | 4/2004 | Platt |
| 6,720,994 B1 | 4/2004 | Grottodden et al. |
| 6,725,719 B2 | 4/2004 | Cardarelli |
| 6,729,176 B2 | 5/2004 | Begin |
| 6,738,721 B1 | 5/2004 | Drucke et al. |
| 6,758,093 B2 | 7/2004 | Tang et al. |
| 6,794,272 B2 | 9/2004 | Turner et al. |
| 6,796,178 B2 | 9/2004 | Jeong et al. |
| 6,823,733 B2 | 11/2004 | Ichinose |
| 6,834,249 B2 | 12/2004 | Orchard |
| 6,843,126 B2 | 1/2005 | Hulsing, II |
| 6,843,127 B1 | 1/2005 | Chiou |
| 6,845,669 B2 | 1/2005 | Acar et al. |
| 6,848,304 B2 | 2/2005 | Geen |
| 6,859,751 B2 | 2/2005 | Cardarelli |
| 6,860,150 B2 | 3/2005 | Cho |
| 6,876,093 B2 | 4/2005 | Goto et al. |
| 6,891,239 B2 | 5/2005 | Anderson et al. |
| 6,892,575 B2 | 5/2005 | Nasiri et al. |
| 6,915,693 B2 | 7/2005 | Kim et al. |
| 6,918,297 B2 | 7/2005 | MacGugan |
| 6,918,298 B2 | 7/2005 | Park |
| 6,938,484 B2 | 9/2005 | Najafi et al. |
| 6,939,473 B2 | 9/2005 | Nasiri et al. |
| 6,952,965 B2 | 10/2005 | Kang et al. |
| 6,955,086 B2 | 10/2005 | Yoshikawa et al. |
| 6,963,345 B2 | 11/2005 | Boyd et al. |
| 6,972,480 B2 | 12/2005 | Zilber et al. |
| 6,981,416 B2 | 1/2006 | Chen et al. |
| 6,985,134 B2 | 1/2006 | Suprun et al. |
| 7,004,025 B2 | 2/2006 | Tamura |
| 7,007,550 B2 | 3/2006 | Sakai et al. |
| 7,026,184 B2 | 4/2006 | Xie et al. |
| 7,028,546 B2 | 4/2006 | Hoshal |
| 7,028,547 B2 | 4/2006 | Shiratori et al. |
| 7,036,372 B2 | 5/2006 | Chojnacki et al. |
| 7,040,163 B2 | 5/2006 | Shcheglov et al. |
| 7,040,922 B2 | 5/2006 | Harney et al. |
| 7,043,985 B2 | 5/2006 | Ayazi et al. |
| 7,057,645 B1 | 6/2006 | Hara et al. |
| 7,077,007 B2 | 7/2006 | Rich et al. |
| 7,093,487 B2 | 8/2006 | Mochida |
| 7,104,129 B2 | 9/2006 | Nasiri et al. |
| 7,106,184 B2 | 9/2006 | Kaminaga et al. |
| 7,121,141 B2 | 10/2006 | McNeil |
| 7,144,745 B2 | 12/2006 | Badehi |
| 7,154,477 B1 | 12/2006 | Hotelling et al. |
| 7,155,975 B2 | 1/2007 | Mitani et al. |
| 7,158,118 B2 | 1/2007 | Liberty |
| 7,159,442 B1 | 1/2007 | Jean |
| 7,168,317 B2 | 1/2007 | Chen et al. |
| 7,180,500 B2 | 2/2007 | Marvit et al. |
| 7,196,404 B2 | 3/2007 | Schirmer et al. |
| 7,209,810 B2 | 4/2007 | Meyer et al. |
| 7,210,351 B2 | 5/2007 | Lo et al. |
| 7,219,033 B2 | 5/2007 | Kolen |
| 7,222,533 B2 | 5/2007 | Mao et al. |
| 7,234,351 B2 | 6/2007 | Perkins |
| 7,236,156 B2 | 6/2007 | Liberty et al. |
| 7,237,169 B2 | 6/2007 | Smith |
| 7,237,437 B1 | 7/2007 | Fedora |
| 7,239,301 B2 | 7/2007 | Liberty et al. |

(56) References Cited

U.S. PATENT DOCUMENTS

| | | |
|---|---|---|
| 7,239,342 B2 | 7/2007 | Kingetsu et al. |
| 7,240,552 B2 | 7/2007 | Acar et al. |
| 7,243,561 B2 | 7/2007 | Ishigami et al. |
| 7,247,246 B2 | 7/2007 | Nasiri et al. |
| 7,250,112 B2 | 7/2007 | Nasiri et al. |
| 7,250,322 B2 | 7/2007 | Christenson et al. |
| 7,253,079 B2 | 8/2007 | Hanson et al. |
| 7,257,273 B2 | 8/2007 | Li et al. |
| 7,258,008 B2 | 8/2007 | Durante et al. |
| 7,258,011 B2 | 8/2007 | Nasiri et al. |
| 7,258,012 B2 | 8/2007 | Xie |
| 7,260,789 B2 | 8/2007 | Hunleth et al. |
| 7,262,760 B2 | 8/2007 | Liberty |
| 7,263,883 B2 | 9/2007 | Park et al. |
| 7,284,430 B2 | 10/2007 | Acar et al. |
| 7,289,898 B2 | 10/2007 | Hong et al. |
| 7,290,435 B2 | 11/2007 | Seeger et al. |
| 7,296,471 B2 | 11/2007 | Ono et al. |
| 7,299,695 B2 | 11/2007 | Tanaka et al. |
| 7,307,653 B2 | 12/2007 | Dutta |
| 7,320,253 B2 | 1/2008 | Hanazawa et al. |
| 7,325,454 B2 | 2/2008 | Saito et al. |
| 7,331,212 B2 | 2/2008 | Manlove et al. |
| 7,333,087 B2 | 2/2008 | Soh et al. |
| 7,352,567 B2 | 4/2008 | Hotelling et al. |
| 7,365,736 B2 | 4/2008 | Marvit et al. |
| 7,377,167 B2 | 5/2008 | Acar et al. |
| 7,386,806 B2 | 6/2008 | Wroblewski |
| 7,395,181 B2 | 7/2008 | Foxlin |
| 7,398,683 B2 | 7/2008 | Lehtonen |
| 7,414,611 B2 | 8/2008 | Liberty |
| 7,421,897 B2 | 9/2008 | Geen et al. |
| 7,421,898 B2 | 9/2008 | Acar et al. |
| 7,424,213 B2 | 9/2008 | Imada |
| 7,437,931 B2 | 10/2008 | Dwyer et al. |
| 7,442,570 B2 | 10/2008 | Nasiri et al. |
| 7,454,971 B2 | 11/2008 | Blomqvist |
| 7,458,263 B2 | 12/2008 | Nasiri et al. |
| 7,474,296 B2 | 1/2009 | Obermeyer et al. |
| 7,489,777 B2 | 2/2009 | Yamazaki et al. |
| 7,489,829 B2 | 2/2009 | Sorek et al. |
| 7,508,384 B2 | 3/2009 | Zhang et al. |
| 7,518,493 B2 | 4/2009 | Bryzek et al. |
| 7,522,947 B2 | 4/2009 | Tsuda |
| 7,526,402 B2 | 4/2009 | Tanenhaus et al. |
| 7,533,569 B2 | 5/2009 | Sheynblat |
| 7,541,214 B2 | 6/2009 | Wan |
| 7,549,335 B2 | 6/2009 | Inoue et al. |
| 7,552,636 B2 | 6/2009 | Datskos |
| 7,557,832 B2 | 7/2009 | Lindenstruth et al. |
| 7,558,013 B2 | 7/2009 | Jeansonne et al. |
| 7,562,573 B2 | 7/2009 | Yazdi |
| 7,593,627 B2 | 9/2009 | Wernersson |
| 7,609,320 B2 | 10/2009 | Okamura |
| 7,617,728 B2 | 11/2009 | Cardarelli |
| 7,621,183 B2 | 11/2009 | Seeger et al. |
| 7,637,155 B2 | 12/2009 | Delevoye |
| 7,642,741 B2 | 1/2010 | Sidman |
| 7,650,787 B2 | 1/2010 | Ino |
| 7,656,428 B2 | 2/2010 | Trutna, Jr. |
| 7,667,686 B2 | 2/2010 | Suh |
| 7,672,781 B2 | 3/2010 | Churchill et al. |
| 7,677,099 B2 | 3/2010 | Nasiri et al. |
| 7,677,100 B2 | 3/2010 | Konaka |
| 7,683,775 B2 | 3/2010 | Levinson |
| 7,688,306 B2 * | 3/2010 | Wehrenberg et al. ......... 345/158 |
| 7,689,378 B2 | 3/2010 | Kolen |
| 7,732,302 B2 | 6/2010 | Yazdi |
| 7,735,025 B2 | 6/2010 | Lee et al. |
| 7,737,965 B2 | 6/2010 | Alter et al. |
| 7,765,869 B2 | 8/2010 | Sung et al. |
| 7,769,542 B2 | 8/2010 | Calvarese et al. |
| 7,779,689 B2 | 8/2010 | Li et al. |
| 7,781,666 B2 | 8/2010 | Nishitani et al. |
| 7,782,298 B2 | 8/2010 | Smith et al. |
| 7,783,392 B2 | 8/2010 | Oikawa |
| 7,784,344 B2 | 8/2010 | Pavelescu et al. |
| 7,795,074 B2 | 9/2010 | Shao et al. |
| 7,796,872 B2 | 9/2010 | Sachs et al. |
| 7,805,245 B2 | 9/2010 | Bacon et al. |
| 7,813,892 B2 | 10/2010 | Sugawara et al. |
| 7,814,791 B2 | 10/2010 | Andersson et al. |
| 7,814,792 B2 | 10/2010 | Tateyama et al. |
| 7,843,430 B2 | 11/2010 | Jeng et al. |
| 7,886,597 B2 | 2/2011 | Uchiyama et al. |
| 7,907,037 B2 | 3/2011 | Yazdi |
| 7,907,838 B2 | 3/2011 | Nasiri et al. |
| 7,924,267 B2 | 4/2011 | Sirtori |
| 7,932,925 B2 | 4/2011 | Inbar et al. |
| 7,970,586 B1 * | 6/2011 | Kahn et al. .................... 702/189 |
| 7,995,852 B2 | 8/2011 | Nakamaru |
| 8,018,435 B2 | 9/2011 | Orchard et al. |
| 8,020,441 B2 | 9/2011 | Seeger |
| 8,022,995 B2 | 9/2011 | Yamazaki et al. |
| 8,035,176 B2 | 10/2011 | Jung et al. |
| 8,047,075 B2 | 11/2011 | Nasiri et al. |
| 8,099,124 B2 | 1/2012 | Tilley |
| 8,113,050 B2 | 2/2012 | Acar et al. |
| 8,139,026 B2 | 3/2012 | Griffin |
| 8,141,424 B2 | 3/2012 | Seeger et al. |
| 8,160,640 B2 | 4/2012 | Rofougaran et al. |
| 8,204,684 B2 | 6/2012 | Forstall et al. |
| 8,230,740 B2 | 7/2012 | Katsuki et al. |
| 8,239,162 B2 | 8/2012 | Tanenhaus |
| 8,250,921 B2 | 8/2012 | Nasiri et al. |
| 8,322,213 B2 | 12/2012 | Trusov et al. |
| 8,351,773 B2 | 1/2013 | Nasiri et al. |
| 8,427,426 B2 | 4/2013 | Corson et al. |
| 2001/0045127 A1 | 11/2001 | Chida et al. |
| 2002/0027296 A1 | 3/2002 | Badehi |
| 2002/0189351 A1 | 12/2002 | Reeds et al. |
| 2003/0159511 A1 | 8/2003 | Zarabadi et al. |
| 2003/0209789 A1 | 11/2003 | Hanson et al. |
| 2004/0016995 A1 | 1/2004 | Kuo et al. |
| 2004/0034449 A1 | 2/2004 | Yokono et al. |
| 2004/0066981 A1 | 4/2004 | Li et al. |
| 2004/0125073 A1 | 7/2004 | Potter et al. |
| 2004/0160525 A1 | 8/2004 | Kingetsu et al. |
| 2004/0179108 A1 | 9/2004 | Sorek et al. |
| 2004/0200279 A1 | 10/2004 | Mitani et al. |
| 2004/0227201 A1 | 11/2004 | Borwick, III et al. |
| 2004/0260346 A1 | 12/2004 | Overall et al. |
| 2005/0023656 A1 | 2/2005 | Leedy |
| 2005/0066728 A1 | 3/2005 | Chojnacki et al. |
| 2005/0110778 A1 | 5/2005 | Ben Ayed |
| 2005/0170656 A1 | 8/2005 | Nasiri et al. |
| 2005/0212751 A1 * | 9/2005 | Marvit et al. .................. 345/156 |
| 2005/0212760 A1 | 9/2005 | Marvit et al. |
| 2005/0239399 A1 | 10/2005 | Karabinis |
| 2005/0262941 A1 | 12/2005 | Park et al. |
| 2006/0017837 A1 | 1/2006 | Sorek et al. |
| 2006/0032308 A1 | 2/2006 | Acar et al. |
| 2006/0033823 A1 | 2/2006 | Okamura |
| 2006/0061545 A1 | 3/2006 | Hughes et al. |
| 2006/0074558 A1 | 4/2006 | Williamson et al. |
| 2006/0115297 A1 | 6/2006 | Nakamaru |
| 2006/0119710 A1 | 6/2006 | Ben-Ezra et al. |
| 2006/0139327 A1 | 6/2006 | Dawson et al. |
| 2006/0164382 A1 | 7/2006 | Kulas et al. |
| 2006/0164385 A1 | 7/2006 | Smith et al. |
| 2006/0184336 A1 | 8/2006 | Kolen |
| 2006/0185502 A1 | 8/2006 | Nishitani et al. |
| 2006/0187308 A1 | 8/2006 | Lim et al. |
| 2006/0197753 A1 | 9/2006 | Hotelling |
| 2006/0208326 A1 | 9/2006 | Nasiri et al. |
| 2006/0219008 A1 | 10/2006 | Tanaka et al. |
| 2006/0236761 A1 | 10/2006 | Inoue et al. |
| 2006/0251410 A1 | 11/2006 | Trutna, Jr. |
| 2006/0256074 A1 | 11/2006 | Krum et al. |
| 2006/0274032 A1 | 12/2006 | Mao et al. |
| 2006/0287084 A1 | 12/2006 | Mao et al. |
| 2006/0287085 A1 | 12/2006 | Mao et al. |
| 2007/0006472 A1 | 1/2007 | Bauch |
| 2007/0029629 A1 | 2/2007 | Yazdi |

(56) References Cited

U.S. PATENT DOCUMENTS

| | | | |
|---|---|---|---|
| 2007/0035630 | A1 | 2/2007 | Lindenstruth et al. |
| 2007/0036348 | A1 | 2/2007 | Orr |
| 2007/0055468 | A1 | 3/2007 | Pylvanainen |
| 2007/0063985 | A1 | 3/2007 | Yamazaki et al. |
| 2007/0113207 | A1 | 5/2007 | Gritton |
| 2007/0123282 | A1 | 5/2007 | Levinson |
| 2007/0125852 | A1 | 6/2007 | Rosenberg |
| 2007/0146325 | A1 | 6/2007 | Poston et al. |
| 2007/0167199 | A1 | 7/2007 | Kang |
| 2007/0176898 | A1 | 8/2007 | Suh |
| 2007/0219744 | A1 | 9/2007 | Kolen |
| 2007/0239399 | A1* | 10/2007 | Sheynblat et al. ............ 702/187 |
| 2007/0273463 | A1 | 11/2007 | Yazdi |
| 2007/0277112 | A1 | 11/2007 | Rossler et al. |
| 2007/0296571 | A1 | 12/2007 | Kolen |
| 2008/0001770 | A1 | 1/2008 | Ito et al. |
| 2008/0009348 | A1 | 1/2008 | Zalewski et al. |
| 2008/0088602 | A1 | 4/2008 | Hotelling |
| 2008/0098315 | A1 | 4/2008 | Chou et al. |
| 2008/0134784 | A1 | 6/2008 | Jeng et al. |
| 2008/0158154 | A1 | 7/2008 | Liberty et al. |
| 2008/0204566 | A1 | 8/2008 | Yamazaki et al. |
| 2008/0303697 | A1 | 12/2008 | Yamamoto |
| 2008/0314147 | A1 | 12/2008 | Nasiri et al. |
| 2008/0319666 | A1 | 12/2008 | Petrov et al. |
| 2009/0005975 | A1 | 1/2009 | Forstall et al. |
| 2009/0005986 | A1 | 1/2009 | Soehren |
| 2009/0007661 | A1 | 1/2009 | Nasiri et al. |
| 2009/0043504 | A1 | 2/2009 | Bandyopadhyay et al. |
| 2009/0088204 | A1 | 4/2009 | Culbert et al. |
| 2009/0128485 | A1 | 5/2009 | Wu |
| 2009/0282917 | A1 | 11/2009 | Acar |
| 2009/0326851 | A1 | 12/2009 | Tanenhaus |
| 2010/0013814 | A1 | 1/2010 | Jarczyk |
| 2010/0033422 | A1 | 2/2010 | Mucignat et al. |
| 2011/0101474 | A1 | 5/2011 | Funk |
| 2012/0154633 | A1 | 6/2012 | Rodriguez |

FOREIGN PATENT DOCUMENTS

| | | |
|---|---|---|
| CN | 101178615 A | 5/2008 |
| CN | 101203821 A | 6/2008 |
| EP | 0429391 | 8/1995 |
| GB | 2428802 | 2/2007 |
| JP | 06-291725 | 10/1994 |
| JP | 10-240434 | 9/1998 |
| JP | 2000-148351 | 5/2000 |
| JP | 2001-174283 | 6/2001 |
| JP | 2001-272413 | 10/2001 |
| JP | 2004-517306 | 6/2004 |
| JP | 2004-258837 | 9/2004 |
| JP | 2005-233701 | 9/2005 |
| JP | 2005-283428 | 10/2005 |
| JP | 2005-345473 | 12/2005 |
| JP | 2006-146440 | 6/2006 |
| JP | 2006-275660 | 10/2006 |
| JP | 2007-041143 | 2/2007 |
| JP | 2007-173641 | 7/2007 |
| JP | 2008-003182 | 1/2008 |
| JP | 2008091523 | 4/2008 |
| JP | 2008-520985 | 6/2008 |
| WO | 0151890 | 7/2001 |
| WO | 2005103863 | 11/2005 |
| WO | 2005109847 | 11/2005 |
| WO | 2006000639 | 1/2006 |
| WO | 2006043890 | 4/2006 |
| WO | WO2006043890 | 4/2006 |
| WO | WO 2006/046098 | 5/2006 |
| WO | 2007147012 | 12/2007 |
| WO | WO 2008/026357 | 3/2008 |
| WO | 2008068542 | 6/2008 |
| WO | 2009016607 | 2/2009 |
| WO | WO2009016607 | 2/2009 |

OTHER PUBLICATIONS

Oboe, R., Lasalandra, E., White, M. M. MEMS-based Accelerometers and their Application to Vibration Suppresion in Hard Disk Drives. MEMS/NEMS Handbook Techniques and Applications vol. 4, Springer 2006, pp. 1-29 see pp. 7-22.

Roberto Oboe, et al., "MEMS-based Accelerometers and their Application to Vibration Suppression in Hard Dish Drives," MEMS/NEMS Handbook Techniques and Application, vol. 4, Springer 2006, pp. 1-29 see pp. 7-22, Dec. 31, 2006.

Singh, Amit, "The Apple Motion Sensor as a Human Interface Device," www.kernelthread.com, 1994-2006.

Cho, et al., Dynamics of Tilt-based Browsing on Mobile Devices. CHI 2007, Apr. 28-May 3, 2007, San Jose, California, USA., pp. 1947-1952.

Liu Jun, et al., "Study on Single Chip Integration Accelerometer Gyroscope," Journal of Test and Measurement Technology, vol. 17, Issue 2, pp. 157-158, Dec. 31, 2003.

Civil Action No. 2:13-cv-405-JRG, "Invalidity Contentions", Oct. 31, 2013.

Civil Action No. 2:13-cv-405-JRG, Exhibit A, Invalidity Charts for U.S. Patent No. 8,347,717, Oct. 31, 2013.

Civil Action No. 2:13-cv-405-JRG, Exhibit C, Motivation to Combine References, Oct. 31, 2013.

Civil Action No. 2:13-cv-405-JRG, Exhibit B, Table of References, Oct. 31, 2013.

Civil Action No. 2:13-cv-405-JRG, Exhibit D, Invalidity Charts for U.S. Patent No. 8,351,773, Oct. 31, 2013.

Civil Action No. 2:13-cv-405-JRG, Exhibit F, Motivation to Combine References, Oct. 31, 2013.

Civil Action No. 2:13-cv-405-JRG, Exhibit E, Table of References, Oct. 31, 2013.

Civil Action No. 2:13-cv-405-JRG, Exhibit G, Invalidity Charts for U.S. Patent No. 8,250,921, Oct. 31, 2013.

Civil Action No. 2:13-cv-405-JRG, Exhibit I, Motivation to Combine References, Oct. 31, 2013.

Civil Action No. 2:13-cv-405-JRG, Exhibit H, Table of References, Oct. 31, 2013.

Jones, A. et al., "Micromechanical Systems Opportunities," 1995, Department of Defense.

Brandl, M. and Kempe, V., "High Performance Accelerometer Based on CMOS Technologies with Low Cost Add-Ons," 2001, IEEE.

Goldstein, H., "Packages Go Vertical," 2001, IEEE/CPMT International Electronics Manufacturing Technology Symposium.

Cardarelli, D., "An Integrated MEMS Inertial Measurement Unit," 2002, IEEE.

Hatsumei, "The Invention," 2003.

Brandl, M., et al., "A Modular MEMS Accelerometer Concept," 2003, AustriaMicroSystems.

Bryzek, J., "MEMS-IC integration remains a challenge," Oct. 29, 2003, EE Times.

Gluck, N. and Last, R., "Military and Potential Homeland Security Applications for Microelectromechanical Systems (MEMS)," Nov. 2004, Institute for Defense Analysis.

Rhee, T., et al., "Development of Character Input System using 3-D Smart Input Device," 2005.

Cho, N., "MEMS accelerometer IOD report," Jan. 31, 2005.

"MST News: Assembly & Packaging," Feb. 2005, VDI/VDE—Innovation + Technick GmbH.

Leondes, C.T., "MEMS/NEMS Handbook Techniques and Applications," 2006, Springer Science+Business Media, Inc.

Higurashi, E., et al., "Integration and Packaging Technologies for Small Biomedical Sensors," 2007.

Jang, S., et al., "MEMS Type Gyro Chip," IT Soc Magazine.

Foxlin, E., et al., "Small type 6-axis tracking system for head mounted display".

* cited by examiner

INTERFACING APPLICATION PROGRAMS AND MOTION SENSORS OF A DEVICE

CROSS REFERENCE TO RELATED APPLICATIONS

This application claims the benefit of U.S. Provisional Application No. 61/022,143, filed Jan. 18, 2008, entitled, "Motion Sensing Application Interface", and is related to co-pending U.S. Utility application Ser. No. 11/774,488 entitled "Integrated Motion Processing Unit (MPU) With MEMS Inertial Sensing And Embedded Digital Electronics", filed Jul. 6, 2007, all of which is incorporated herein by reference in its entirety.

FIELD OF THE INVENTION

The present invention relates generally to motion sensing devices, and more specifically to interfacing application programs to motion sensors of a device.

BACKGROUND OF THE INVENTION

Motion sensors, such as accelerometers or gyroscopes, are often used in electronic devices. Accelerometers can be used for measuring linear acceleration and gyroscopes can be used for measuring angular velocity. The markets for motion sensors include mobile phones, video game controllers, PDAs, mobile internet devices (MIDs), personal navigational devices (PNDs), digital still cameras, digital video cameras, and many more. For example, cell phones may use accelerometers to detect the tilt of the device in space, which allows a video picture to be displayed in an orientation corresponding to the tilt. Video game console controllers may use accelerometers and/or gyroscopes to detect motion of the hand controller that is used to provide input to a game. Picture and video stabilization is an important feature in even low- or mid-end digital cameras, where lens or image sensors are shifted to compensate for hand jittering measured by a gyroscope. Global positioning system (GPS) and location base service (LBS) applications rely on determining an accurate location of the device, and motion sensors are often needed when a GPS signal is attenuated or unavailable, or to enhance the accuracy of GPS location finding.

Most existing electronic devices tend to use only the very basic of motion sensors, such as an accelerometer with "peak detection" or steady state measurements. For example, current mobile phones use an accelerometer to determine tilting of the device, which can be determined using a steady state gravity measurement. Such simple determination cannot be used in more sophisticated applications using, for example, gyroscopes or other applications having precise timing requirements. Without a gyroscope included in the device, the tilting and acceleration of the device is not sensed reliably. This is often misleading in non-gyroscope navigational devices; for example, a "non-gyroscope" dead reckoning feature can misjudge automobile location for several blocks while the automobile is stopped at a sloped traffic light. And since motion of the device is not always linear or parallel to the ground, measurement of several different axes of motion using an accelerometer or gyroscope is required for greater accuracy.

More sophisticated motion sensors typically are not used in electronic devices. For example, image stabilization and dead reckoning features are both important features for a mobile phone with GPS or a higher-resolution camera, but there is no available solution in the current mobile phone market. Some attempts have been made for more sophisticated motion sensors in particular applications, such as detecting motion with certain movements. But most of these efforts have failed or are not robust enough as a product. This is because the use of motion sensors to derive motion is complicated. For example, when using a gyroscope, it is not trivial to identify the tilting or movement of a device. Using motion sensors for image stabilization, for sensing location, or for other sophisticated applications, requires in-depth understanding of motion sensors, which makes motion sensing design very difficult.

The difficulty of motion sensing design also causes difficulty in porting a design from one system to another system. Most raw data from motion sensors is gathered and processed at the level of the application software running on the device, which does not allow for other applications to utilize the same sensor output. Furthermore, motion sensing design is typically very system dependent and intended for one specific application, which prevents it from being ported to other systems. For example, image stabilization software is typically very dependent on the particular hardware of the digital camera in which it is used, such as the available picture resolution and range of zoom.

Accordingly, a system and method that provides a simple application interface (API) to be available for different applications, allowing motion sensor data collection to be more easily defined and used by the user, and allow easier porting and maintenance of a motion sensing design for different hardware requirements, would be desirable in many applications.

SUMMARY OF THE INVENTION

The invention of the present application relates to interfacing application programs to motion sensors of a device. In one aspect of the invention, providing an interface for one or more applications provided on a motion sensing device includes receiving a high-level command from an application program running on the motion sensing device, where the application program implements one of a plurality of different types of applications available for use on the motion sensing device. The high-level command requests high-level information derived from the output of motion sensors of the motion sensing device that include rotational motion sensors and linear motion sensors. The high-level command is translated to cause low-level processing of motion sensor data output by the motion sensors, the low-level processing following requirements of the type of application and intelligently determining the high-level information in response to receiving the high-level command. The application program is ignorant of the low-level processing, and the high-level information is provided to the application program.

In another aspect of the invention, a method for providing motion sensor data from motion sensors to an application program running on a motion sensing device, includes sampling motion sensor data output by the motion sensors at a first sampling rate, where the motion sensors include rotational motion sensors and linear motion sensors. The motion sensor data is stored in a buffer, and at least a portion of the buffered motion sensor data is retrieved for the application program at a second sampling rate required by an application implemented by the application program, the second sampling rate being lower than the first sampling rate.

In another aspect of the invention, a method for processing motion sensor data from motion sensors on a motion sensor device includes sampling motion sensor data output by the motion sensors at a first sampling rate, such that the motion sensor data is used to provide information to a first application program implementing a first application on the motion sensor device. The motion sensors include rotational motion sensors and linear motion sensors. The motion sensor data is low-pass filtered to a second sampling rate lower than the first sampling rate, wherein the filtered motion sensor data is used to provide information to a second application program implementing a second application on the motion sensor device different from the first application. The first and second application programs are running simultaneously on the motion sensor device, and the first application requires motion sensor data to be sampled at sampling rate greater than the second sampling rate.

Aspects of the present invention provide an application programming interface to be available for applications running on a motion sensing device. The interface allows easy development of application programs using complex motion sensor data in devices having motion sensors, allows application programs to be ported to and from different motion sensing devices having different hardware and operating systems, and provides easier maintenance of systems. Other aspects of the invention relax the sampling rate requirements and reduce the processing for an application program to sample information related to sensor data, and allow application programs with different sensor data sampling requirements to run simultaneously on a motion sensing device.

DETAILED DESCRIPTION

The present invention relates generally to motion sensing devices, and more specifically to interfacing application programs to motion sensors of a device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

To more particularly describe the features of the present invention, please refer to FIGS. 1-8D in conjunction with the discussion below.

Figure 1:
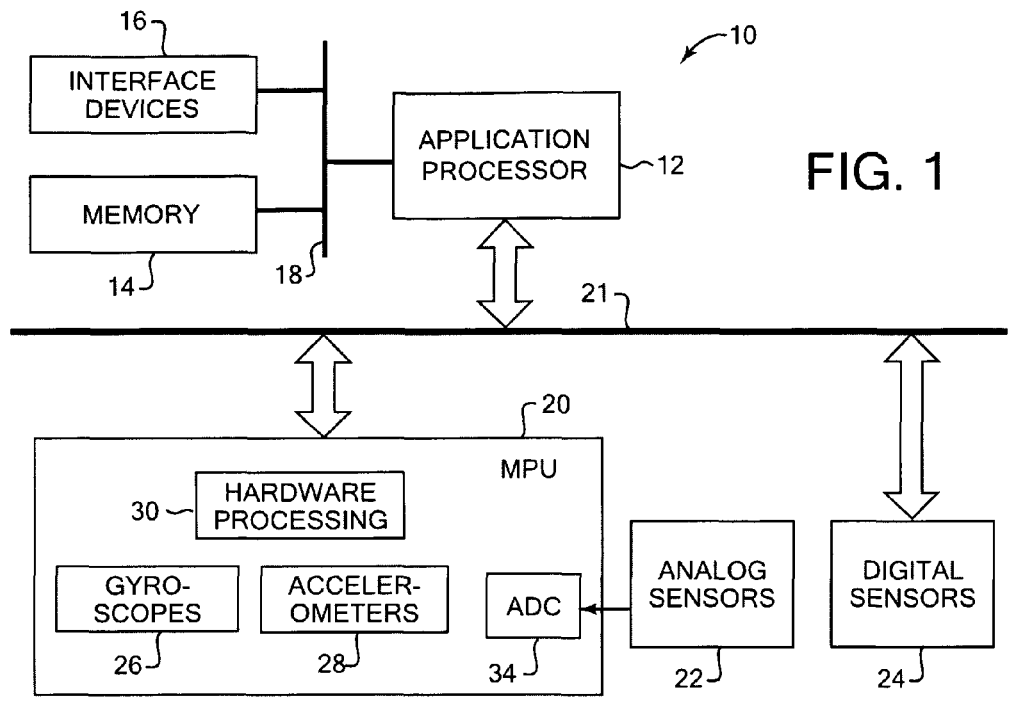
FIG. 1 is a block diagram of a motion sensing device suitable for use with the present invention.

FIG. 1 is a block diagram of a motion sensing system or device 10 suitable for use with the present invention. Device 10 can be provided as a device or apparatus, such as a portable device that can be moved in space by a user and its motion and/or orientation in space therefore sensed. Such a portable device can be a mobile phone, personal digital assistant (PDA), video game player, video game controller, navigation device, mobile internet device (MID), personal navigation device (PND), digital still camera, digital video camera, binoculars, telephoto lenses, or other portable device, or a combination of one or more of these devices. In other embodiments, portions of device 10 can be provided in a portable or movable device, while other portions can be provided in a non-portable device such as a desktop computer, electronic tabletop device, server computer, etc. which can communicate with the moveable or portable portion, e.g., via network connections.

Device 10 includes an application processor 12, memory 14, interface devices 16, a motion processing unit 20, analog sensors 22, and digital sensors 24. Application processor 12 can be one or more microprocessors, central processing units (CPUs), or other processors which run different software programs for the device 10. For example, different software application programs such as menu navigation software, games, camera function control, navigation software, and phone or other functional interfaces can be provided. In some embodiments, multiple different applications can be provided on a single device 10, and in some of those embodiments, multiple applications can run simultaneously on the device 10. Examples of software running on the application processor are described in greater detail below with respect to FIGS. 3 and 4.

Device 10 also includes components for assisting the application processor 12, such as memory 14 (RAM, ROM, Flash, etc.) and interface devices 16. Interface devices 16 can be any of a variety of different devices providing input and/or output to a user, such as a display screen, audio speakers, buttons, touch screen, joystick, slider, printer, scanner, camera, etc. Memory 14 and interface devices 16 can be coupled to the application processor 12 by a bus 18.

Device 10 also can include a motion processing unit (MPU™) 20. The MPU is a device including motion sensors that can measure motion of the device 10 (or portion thereof) in space. For example, the MPU can measure one or more axes of rotation and one or more axes of acceleration of the device. In some embodiments, the components to perform these functions are integrated in a single package. The MPU 20 can communicate motion sensor data to an interface bus 21, to which the application processor 12 is also connected. In one embodiment, processor 12 is a controller or master of the bus 21. For example, in some embodiments the interface bus 21 can be a digital serial interface bus implemented according to such standards as I2C or Serial Peripheral Interface (SPI) bus. Some embodiments can provide bus 18 as the same bus as interface bus 21.

MPU 20 includes motion sensors, including one or more rotational motion sensors 26 and one or more linear motion sensors 28. For example, in some embodiments, the rotational motion sensors are gyroscopes and the linear motion sensors are accelerometers. Gyroscopes 26 can measure the angular velocity of the device 10 (or portion thereof) housing the gyroscopes 26. From one to three gyroscopes can typically be provided, depending on the motion that is desired to be sensed in a particular embodiment. Accelerometers 28 can measure the linear acceleration of the device 10 (or portion thereof) housing the accelerometers 28. From one to three accelerometers can typically be provided, depending on the motion that is desired to be sensed in a particular embodiment. For example, if three gyroscopes 26 and three accelerometers 28 are used, then a 6-axis sensing device is provided providing sensing in all six degrees of freedom.

In some embodiments the gyroscopes 26 and/or the accelerometers 28 can be implemented as MicroElectroMechanical Systems (MEMS). Supporting hardware such as storage registers for the data from motion sensors 26 and 28 can also be provided.

In some embodiments, the MPU 20 can also include a hardware processing block 30. Hardware processing block 30 can include logic or controllers to provide processing of motion sensor data in hardware. For example, motion algorithms, or parts of algorithms, may be implemented by block 30 in some embodiments. Some embodiments can include a hardware buffer in the block 30 to store sensor data received from the motion sensors 26 and 28. For example, in some embodiments described herein, the hardware buffer stores sensor data to be sampled by motion algorithms, as described in greater detail below with respect to FIGS. 8A-8D.

One example of an MPU 20 is described below with reference to FIG. 2. Other examples of an MPU suitable for use with the present invention are described in co-pending U.S. patent application Ser. No. 11/774,488, filed Jul. 6, 2007, entitled, "Integrated Motion Processing Unit (MPU) With MEMS Inertial Sensing and Embedded Digital Electronics," and incorporated herein by reference in its entirety. Suitable implementations for MPU 20 in device 10 are available from Invensense, Inc. of Santa Clara, Calif.

The device 10 can also include other types of sensors. Analog sensors 22 and digital sensors 24 can be used to provide additional sensor data about the environment in which the device 10 is situation. For example, sensors such as a barometer, a compass, a temperature sensor, optical sensor (such as a camera sensor, infrared sensor, etc.), ultrasonic sensor, radio frequency sensor, or other types of sensors can be provided. In the example implementation shown, digital sensors 24 can provide sensor data directly to the interface bus 21, while the analog sensors can be provide sensor data to an analog-to-digital converter (ADC) 34 which supplies the sensor data in digital form to the interface bus 21. In the example of FIG. 1, the ADC 34 is provided in the MPU 20, such that the ADC 34 can provide the converted digital data to hardware processing 30 of the MPU or to the bus 21. In other embodiments, the ADC 34 can be implemented elsewhere in device 10.

Figure 2:
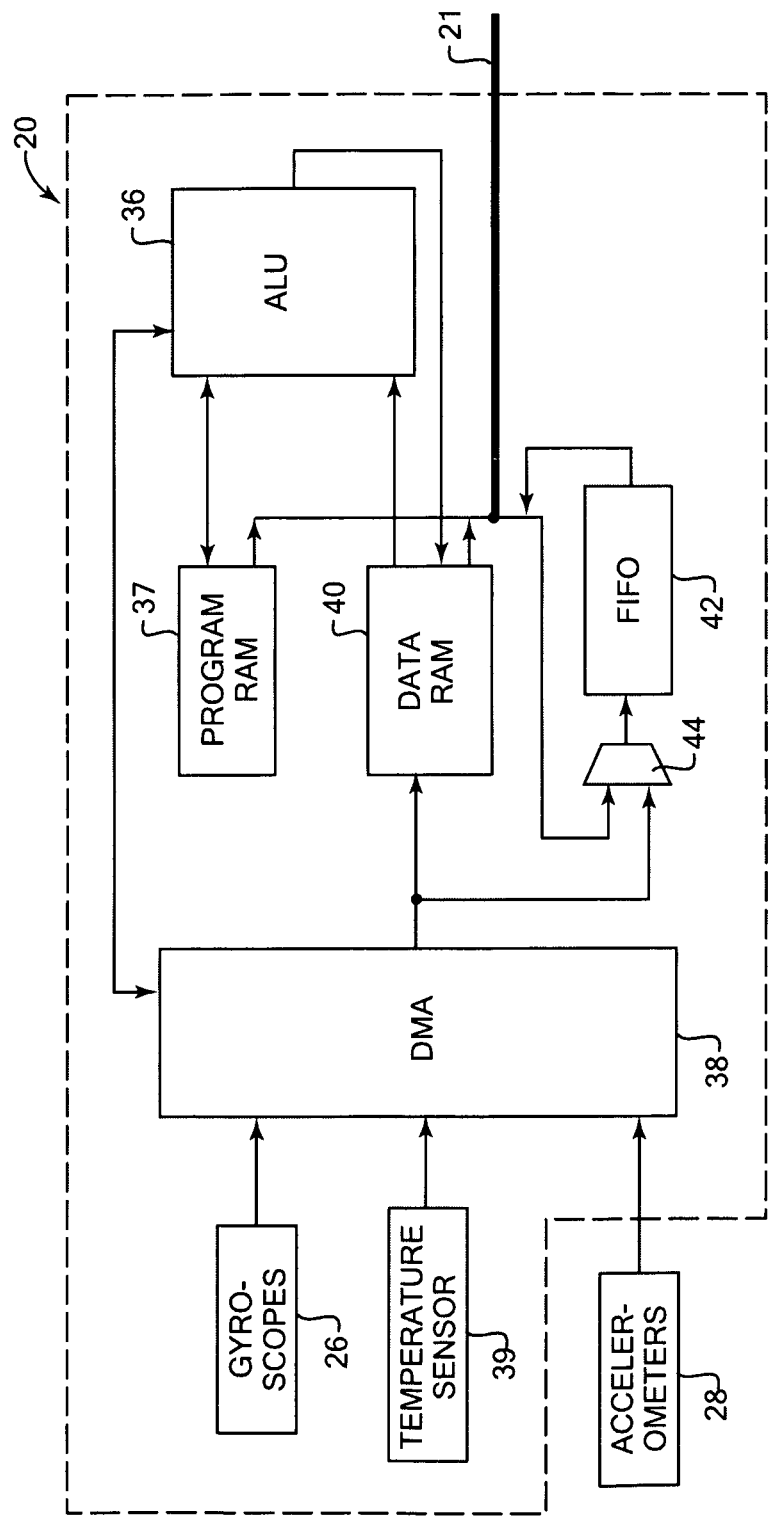
FIG. 2 is a block diagram of one embodiment of a motion processing unit suitable for use with the present invention.

FIG. 2 shows one example of an embodiment of motion processing unit 20 suitable for use with the inventions described herein. The MPU 20 of FIG. 2 includes an arithmetic logic unit (ALU) 36, which performs processing on sensor data. The ALU 36 can be intelligently controlled by one or more programs stored in and retrieved from program RAM (random access memory) 37. The ALU 36 can control a direct memory access (DMA) block 38, which can read sensor data independently of the ALU 36 or other processing unit, from motion sensors such as gyroscopes 26 and accelerometers 28 as well as other sensors such as temperature sensor 39. Some or all sensors can be provided on the MPU 20 or external to the MPU 20; e.g., the accelerometers 28 are shown in FIG. 2 as external to the MPU 20. The DMA 38 can also provide interrupts to the ALU regarding the status of read or write operations. The DMA 38 can provide sensor data read from sensors to a data RAM 40 for storage. The data RAM 40 provides data to the ALU 36 for processing, and the ALU 36 provides output, including processed data, to the data RAM 40 for storage. Bus 21 (also shown in FIG. 1) can be coupled to the outputs of data RAM 40 and/or FIFO buffer 42 so that application processor 12 can read the data read and/or processed by the MPU 20.

A FIFO (first in first out) buffer 42 can be used as a hardware buffer for storing sensor data which can be accessed by the application processor 12 over the bus 21. The use of a hardware buffer such as buffer 42 is described in several embodiments below. For example, a multiplexer 44 can be used to select either the DMA 38 writing raw sensor data to the FIFO buffer 42, or the data RAM 40 writing processed data to the FIFO buffer 42 (e.g., data processed by the ALU 36).

The MPU 20 as shown in FIG. 2 thus can support one or more implementations of processing motion sensor data. For example, the MPU 20 can process raw sensor data fully, where programs in the program RAM 37 can control the ALU 36 to intelligently process sensor data and provide high-level data to the application processor 12 and application programs running thereon. Or, raw sensor data can be pre-processed or processed partially by the MPU 20 using the ALU 36, where the processed data can then be retrieved by the application processor 12 for additional low-level processing on the application processor 12 before providing resulting high-level information to the application programs. Or, raw sensor data can be merely buffered by the MPU 20, where the raw sensor data is retrieved by the application processor 12 for the required low-level processing into high-level data for the application programs. In some embodiments, different applications or application programs running on the same device 10 can use different ones of these processing methods as is most suitable to the application or program.

Figure 3:
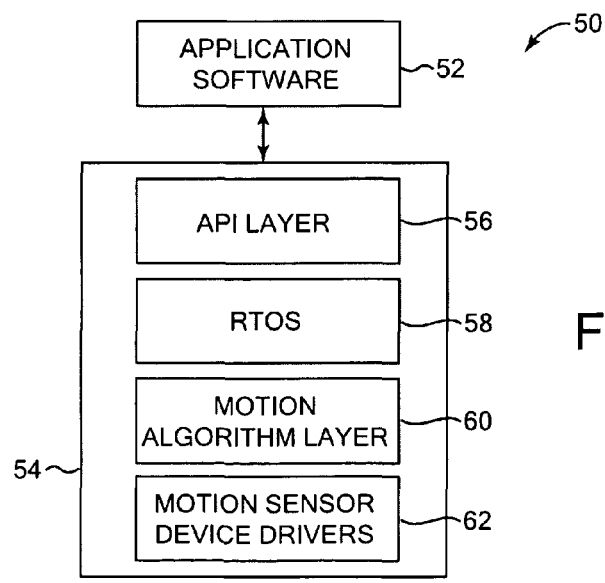
FIG. 3 is a block diagram illustrating an example of a software hierarchy of the present invention.

FIG. 3 is a block diagram illustrating an example of a software hierarchy 50 of the present invention that can be implemented/execute on the application processor 12 of the motion sensing device 10. The layers of software can be provided on a computer readable medium such as electronic memory or other storage medium such as hard disk, optical disk, etc.

An application software layer 52 includes one or more application programs typically provided by one or more application developers and run on the application processor 12. An application program implements a particular application (or portion thereof) (which can also be referred to as a "mode") on the device 10, e.g., each application is implemented by one or more application programs. The application programs can provide processing and input/output functions as well as the appropriate user interface functions specific to their application, such as controlling a camera lens and displaying images in a camera application, implementing a game in a game application, outputting directions and current location of the device 10 in a navigation application, etc.

The application software layer 52 communicates with system software 54, which manages the resources of the device, including communication between hardware and software components. The software structure for the motion sensing in embedded system applications can be defined in separate layers as shown in FIG. 3. Thus, system software 54 includes an application programming interface (API) layer 56, a real-time operating system (RTOS) layer 58, a motion algorithm layer 60, and a sensor device driver layer 62. Additional layers can also be included as appropriate.

API layer 56 provides a set of abstracted and high-level functions for an application program to use, which greatly simplifies the interface and communication between an application program and lower-level components of the device 10 such as the motion sensors. The API layer facilitates an interface to the motion sensing engine of the device 10 by providing a "motion library" of different low-level functions or algorithms to use which are related to motion sensor data. A particular API within the API layer 56 can be defined to correspond to one or more motion algorithms, where those corresponding algorithm(s) can be used by an application accessing that API.

The API layer 56 can provide predefined, high-level, abstracted commands as well as associated control parameters or settings to be used by an application program to receive information, including high-level information, based on motion sensor data sampled from the motion sensors of the device 10. The API layer 56 translates a high-level command from the application program to the necessary motion algorithms needed to implement the command, and can thus translate a request for information related to a particular application, to the processing necessary for that particular application. Each type of application running on the device 10 requires a particular set of motion-based high-level data based on the functions of that application type. For example, a user motion/cursor control type of application may require 2-D or 3-D coordinates based on motion of device 10, while an image stabilization type of application may require an indication of blur and related information based on motion of device 10. The motion algorithms the API accesses know the precise requirements associated with the low-level processing of motion sensor data to obtain a particular type of high-level information that was commanded by the application program, as related to the application associated with the high-level command. For example, the motion algorithms know to sample motion sensor data from the motion sensors at a higher sampling rate, such as 500 Hz, for an image stabilization application, after having received a high-level command that indicates it will be used for the image stabilization application or function.

Thus the low-level processing can intelligently determine high-level information required by the application program and provide it to the application programs, while the application program can be ignorant of any required low-level processing of motion sensor data, and processing and timing requirements used in that processing, needed to obtain the high-level information. For example, an application program developer need only make a call with an API command to, for example, receive processed motion sensor data appropriate to the developer's application, without having to know how to collect and process raw sensor data. The API layer 56 can be defined as operation system independent as possible to make application software as portable as possible.

The API layer 56 can provide multiple particular types of APIs that are useful for one or more types of applications that can be implemented and used on the device 10. For example, a particular motion sensing type of API can be provided, which may be used by certain applications such as cell phone or gaming applications. Multiple different types of applications can preferably be implemented on the device 10, and multiple different APIs for these applications are provided. Some types of applications may have no need for a particular type of API. For example, a navigation application may not need to use an image stabilization API.

In some embodiments, the API can be broken down into a low-level API (e.g., raw data acquisition, calibrated data acquisition, initializing sensors, setting parameters, performing mathematical functions), a mid-level API (e.g., getting processed data such as roll, pitch, and yaw, heading, location, or blur amount), and a high-level API (e.g., running a DR Kalman filter in one line of code). A mid-level API may be used by application developers that wish to construct their own application from more basic algorithmic building blocks. Other embodiments can provide only two of the API layer levels. The API software runs efficiently in the background during system operation, and the application programs in layer 52 can be provided in any of several different computer languages or formats. Thus, "bindings" can be created for the API layer 56 that allow it to be used with other programming languages.

RTOS layer 58 can be provided as an operating system for the device 10 to control and manage system resources in real time and enable functions of the application software 52 as well as other layers such as the API layer 56, motion algorithm layer 60, and motion sensor device drivers 62. The operating system can interface application programs with other software and functions of the device 10. RTOS layer 58 can be any of a variety of available operating systems suited for embedded systems with real time operation. The RTOS layer 58 can communicate with any of the other layers, including the application software 52 which uses functions provided by the RTOS layer 58. RTOS layer 58 can be implemented as a specific operating system for the device 10, or a more general operating system adapted for use with the device 10.

Motion algorithm layer 60 provides a "motion library" of motion algorithms that provide intelligent, lower-level processing for raw sensor data provided from the motion sensors and other sensors. Such algorithms in layer 60 can take the raw sensor data and combine and form the data into high-level information, and/or application-specific information.

For example, a motion algorithm can take motion sensor data from several motion sensors and process and/or combine the data into high-level information useful for a particular application, such as roll/pitch/yaw of the device, or X and Y coordinates for positioning a cursor on a two-dimensional screen. An algorithm typically has precise timing requirements for sampling the motion sensor data from the motion sensors. For example, an algorithm may accumulate motion sensor data and integrate the data points to obtain an angle of motion or other motion characteristic of the device 10. In addition, the algorithms can use data from one or more other sensors, in addition to motion sensor data, to determine the high-level information, such as from a pressure, temperature, and/or direction sensor. The output of the algorithms can be reported to or retrieved by the API layer 56 which provides the high-level information to an application program, and so the processing performed by the motion algorithms need not be known by any application developer. The developer need only use the API functions provided in the API layer 56 to request desired high-level information based on motion sensor data.

A motion algorithm can be associated with one or more particular applications and/or APIs. For example, a "motion sensing" API can use a gesture recognition motion algorithm that checks a sequence of sensor data and outputs a determined "feature" such as a gesture when such a feature is detected. This gesture detection is in turn defined in the API layer 56 as a simple command, input or event for the application software. The motion algorithm can be designed as operation system independent as possible, which reduces obstacles in porting the algorithms between different systems.

The sensor device driver layer 62 provides a software interface to the hardware sensors of the device 10. The driver layer 62 provides an interface with multiple types of sensors of the device 10, including the gyroscopes 26, accelerometers 28, and other sensors 22 and 24 as described with reference to FIG. 1. For example, the sensed results from motion sensors 26 and 28 can be written into registers in the MPU by the hardware, and those registers are then accessed by the device driver layer 62. The driver layer 62 can then provide the accessed sensor data to one or more motion algorithms in the motion algorithm layer 60 for processing. In some embodiments, the device driver layer 62 interfaces with the hardware processing 30 of the MPU, where the hardware processing may have processed some sensor data using motion algorithms.

Figure 4:
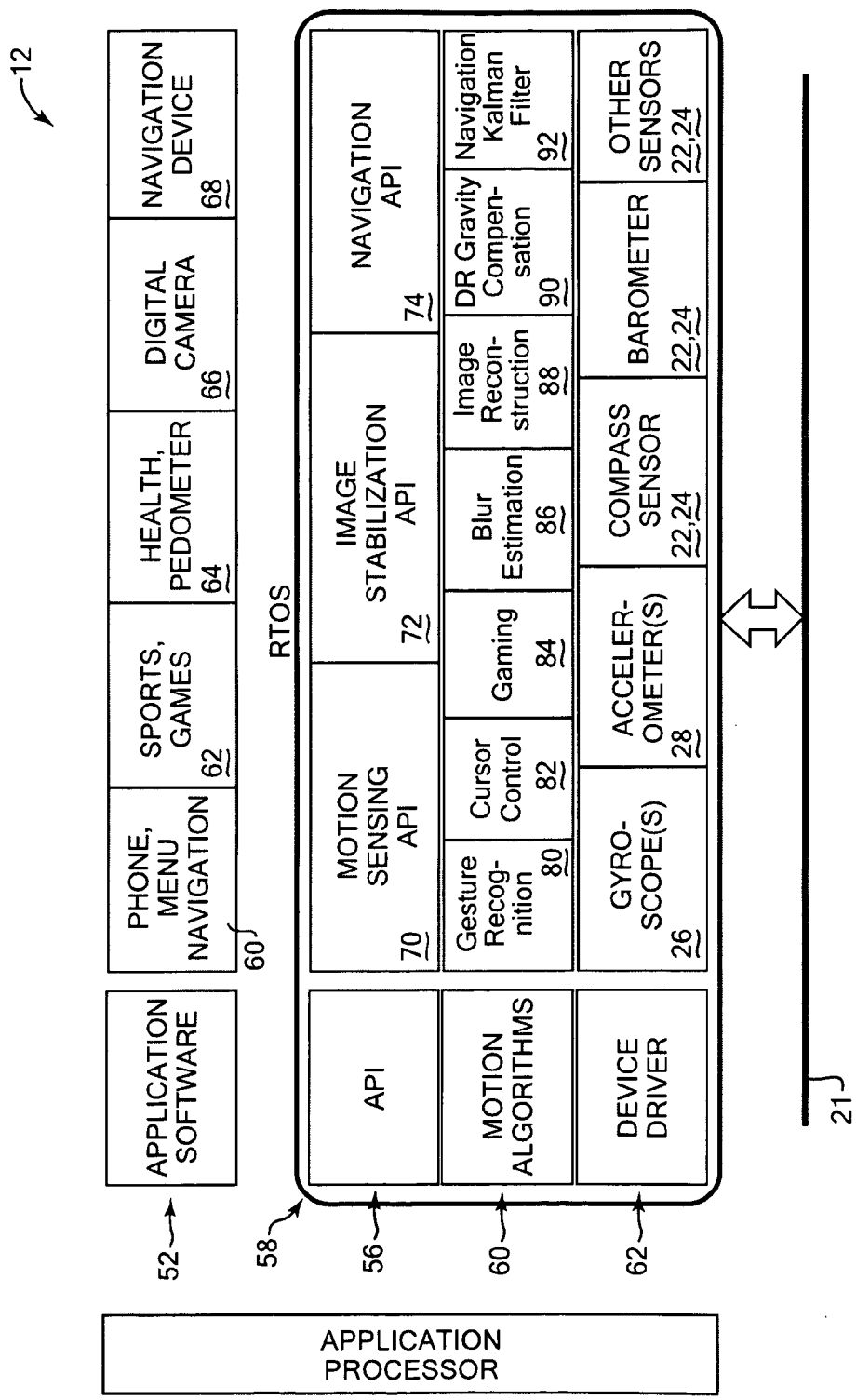
FIG. 4 is a block diagram illustrating examples of software layers of FIG. 3 running on an application processor.

FIG. 4 is a block diagram illustrating examples of software layers of FIG. 3 running on the application processor 12. The application software layer 52 can include multiple different application programs to implement a variety of different types of applications. For example, a mobile phone application can be implemented by one or more application programs 60 for implementing phone functions (calling other phones, receiving calls and providing them to the user, etc.), as well as menu navigation. One or more game applications can be implemented by application programs 62 that provide different video games, such as displaying graphical images on a two-dimensional display screen of the device 10 and outputting sound from audio speakers of the device 10, and changing the output based on user input via buttons, knobs, joystick, stylus, touch pad or touchscreen, microphone, or other input device. A health application can be implemented by health and pedometer application programs 64 for controlling and displaying a pedometer measuring the walking distance of a user, and measuring other body characteristics. A digital camera application can be implemented by application programs 66 for controlling a digital still camera or digital video camera, including image stabilization, zoom and resolution functions, etc. A navigation application can be implemented by application programs 68 for personal navigational devices (PNDs), pedestrian dead reckoning (PDR), or other navigational functions, and can include application programs to control these devices and output navigational results to the user, such as current location.

The RTOS layer 58 can oversee the other software layers including the API layer 56, the motion algorithms layer 60, and the sensor device driver layer 62. The API layer 56 can include different types of APIs, each API characterized for a specific type of high-level information that may be useful to one or more application programs that can be executed by the device 10. In the example of FIG. 4, the API layer 56 includes a motion sensing API 70, an image stabilization API 72, and a navigation API 74.

The motion sensing API 70 can include high-level commands and functions for requesting high-level information that describes motion of the device 10 (or a portion thereof) or describes features determined by the motion of the device. Such high-level functions can include gesture recognition, which recognizes particular motions input by a user to invoke a particular command. For example, a gesture can include moving the device 10 in a particular direction/orientation or in a sequence of directions/orientations, and/or for a specified duration, to initiate a function associated with that gesture, such as "delete," "pan," "zoom," etc. The API 70 can allow the application program developer to simply request whether any of particular predefined gestures have been detected, without the developer having to know how to check for those gestures using raw motion sensor data or how to process that sensor data using appropriate algorithms. Other motion sensor applications include requesting motion data relating to user interface functions such as scrolling a view or cursor control, and requesting data indicating input has been provided to a game, such as motion/orientation data or a gesture to move a graphical object on a screen or activate a function within the game, such as firing a weapon or opening a door.

Another example of a different API in the API layer 56 is an image stabilization API 72. This API allows an application program to request status of the device 10 relating to high-level image stabilization functions, e.g., as used in a digital still camera or video camera. For example, such high-level image stabilization functions can include estimating the amount or degree of blur within an image that has been captured by the camera lens based on the amount of particular motions detected during image capture. The API 72 can allow an application program to simply request the amount of blur in an image, where the application program does not have to compute this blur using raw sensor data or process the raw sensor data with algorithms. Other high-level image stabilization functions can include image reconstruction, in which the application program can request digital processing on a captured image to correct or reconstruct the original color or other characteristics of a blurred image, without having to perform that digital processing itself. Other image stabilization functions can include generating a point spread function (PSF), blending images, or evaluating an image for particular characteristics related to motion sensing (such as blur).

Another example of a different API in the API layer 56 is a navigation API 74. This API allows an application program to request status of the device 10 relating to high-level navigation functions, e.g., as used with navigational devices. For example, such high-level navigation functions can include providing a dead reckoning location of the device 10, and compensating for gravity in such a dead-reckoning estimation. The API 74 can allow an application program to simply request that gravity be compensated for in the data, rather than having to perform this compensation itself. Other high-level navigation functions can include applying a navigation Kalman filter to the sensor data, to compensate for error in recorded position when providing continuously-updated information about the position and/or velocity of the device 10, and setting a noise matrix or a process matrix.

The different APIs in the API layer 56 can all be provided on a single device 10 that implements the different multiple applications in the application layer 52. The ease of using the APIs allows a large and quite different variety of applications to be provided on a single device 10 without each application developer being required to have specialized knowledge in the collection and processing of motion sensor data for a particular application. In some embodiments, the multiple applications can be executed simultaneously on the device 10. This is described in greater detail below with respect to FIG. 7.

The motion algorithms layer 60 can include algorithms, such as filters, which are called by the APIs in the API layer 56. Some of the motion algorithms can be basic functional algorithms, such as providing the current orientation of the device 30 in space, or indicating whether the device is currently being moved in space or not. Algorithms can combine the outputs of different sensors and process the results (e.g. using integration, derivatives, etc.) to deliver higher accuracy sensing results, as well as providing higher level information derived from the raw sensor data.

More specific algorithms can also be included for particular applications. For example, the motion algorithm programs can include gesture recognition algorithms 80 for use with the motion sensing API 70, which determine whether particular gestures have been made by a user with an input device. Such algorithms can determine if the user input a "tapping" gesture or other gesture based on sensor data, etc. or, for a more "mid-level" API, provide roll, pitch and yaw of the device or z-rotation of the device. Similarly, cursor control algorithms 82 can be used with the motion sensing API 70 to determine the X-Y coordinates for a user input device, at which location a cursor is to be displayed on a display screen, based on roll, pitch and yaw data as determined by the algorithm from raw motion sensor data. Other user interface and continuous control algorithms can also be used, such as for determining whether icons on a display screen have been selected by a user based on sensor input, compensation for hand jitter during cursor control, and moving one or more displayed images based on motion sensor data. Gaming algorithms 84 can be used with the motion sensing API 70 to provide data related to a gaming application, such as whether a particular gesture or motion was received which the application uses as input to control a game function.

Image stabilization algorithms can include blur estimation and image reconstruction algorithms. Blur algorithms 86 can be used to determine whether a blur has occurred in an image based on motion sensor data at the time of image capture, such as an image captured by a camera lens. For example, a point spread function (PSF) can be used by the algorithm to determine the blurriness. Image reconstruction algorithms 88 can be used to correct or reconstruct characteristics of an image that may have been distorted or removed, e.g., through blur. Other image stabilization algorithms are described in copending U.S. patent application Ser. No. 11/774,488, and incorporated herein by reference in its entirety. Navigation algorithms can include dead reckoning gravity compensation algorithms 90 that can be used to compensate for gravity when determining a dead reckoning, and a navigation Kalman filter 92 that can be used to compensate for errors in sensed positions. For example, a dead reckoning location algorithm can use data from one or more of the accelerometers to determine position of the device 10 and data from one or more of the gyroscopes 26 to determine the heading or direction of motion of the device 10.

The device driver layer 62 provides a software interface to the hardware motion sensors 26 and 28 of the device 10 and other sensors 22 and 24, as described above with respect to FIG. 3. The layer 62 can include drivers for gyroscopes 26, accelerometers 28, barometer, compass sensor, and other sensors as described with reference to FIG. 1.

Figure 5:
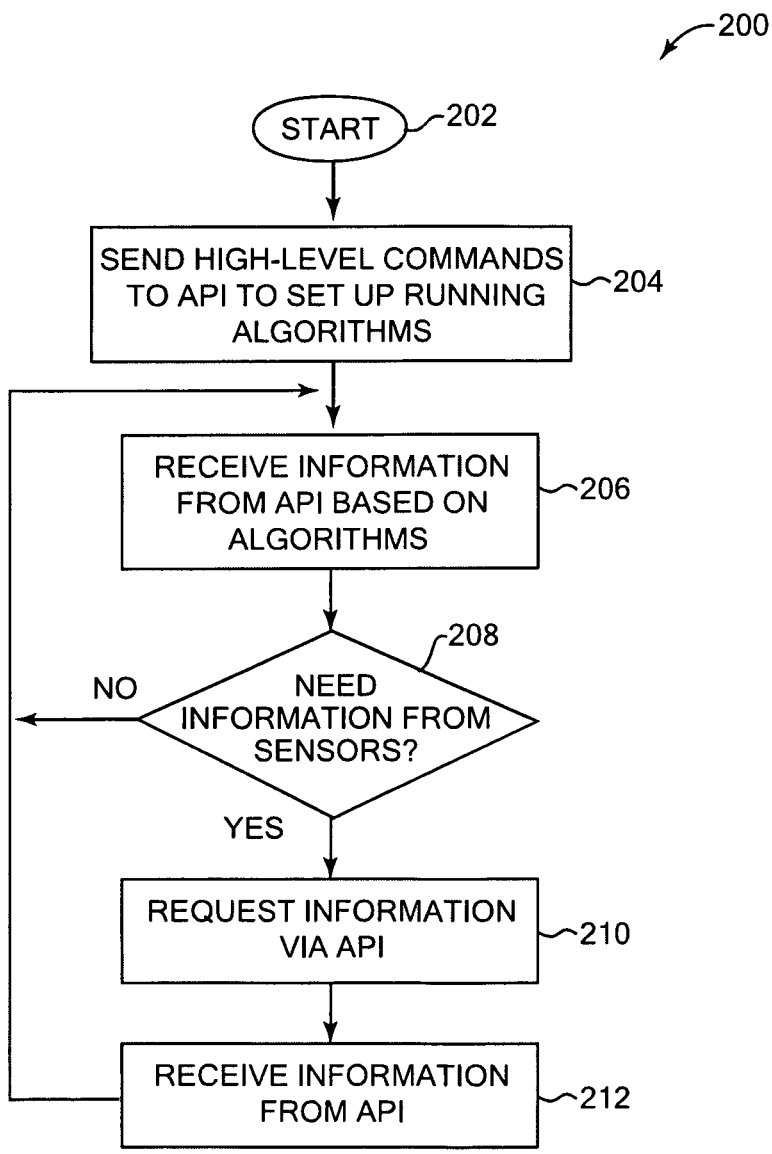
FIG. 5 is a flow diagram illustrating a method of the present invention of an application program accessing an API implemented on the motion sensing device.

FIG. 5 is a flow diagram illustrating a method 200 of the present invention of an application program accessing an API implemented on the motion sensing device 10. The method 200 and the other methods described herein, if not specifically described, can be implemented in hardware, software, or a combination of both hardware and software. The methods herein can be implemented using program instructions or program code that can be executed by a processor or computer and can be provided on a computer readable medium, such as electronic memory, magnetic tape, magnetic disk, optical disk, etc.

In the method 200, an application program interfaces with a particular API of the API layer 56 which provides motion sensing functions useful for the application program. In some embodiments, multiple applications can interface with a single API, while other application programs may have a dedicated API for their exclusive use. An application program can also access multiple types of APIs, as necessary. The interfacing with the API is at a high level that allows the application program to ignore the implementation details of the information it requests. Thus, for example, a command to the API can be an equivalent to "provide the current location of the device" or "provide the blur kernel for the last image" or "provide the type of movement the device is exhibiting currently."

An API of the present invention can also use "event driven programming." For example, when using a motion sensing API, the application program does not typically need to check the input of the motion sensors every 10 ms. Instead, if the application program is looking for a gesture composed of particular motion sensor data, it requests the API to interrupt the application program when that gesture is detected (this is an "event"). Examples of the use of an API of the present invention by an application program is shown below in Listings 1 and 2, where "ml" stands for "motion library").

---
LISTING 1
---
mlInitializeSensors( );
mlRegisterGestures (ML_DOUBLE_TAP | ML_ROLL);
mlGestureCallBack (got Gesture);
...
void gotGesture(gesture) {
    if (gesture == ML_DOUBLE_TAP) {
    [...If the double tap gesture is detected, perform the functions or operations listed here.]
    }
    else if (gesture==ML_ROLL) {
    [...If the roll gesture is detected, perform the functions or operations listed here.]
    }
}

---
LISTING 2
---
ml.Bind(ml.EVT_DOUBLE_TAP, OnDoubleTap) // when a double tap gesture is detected, run the function "OnDoubleTap"
ml.Bind(ml.EVT_ORIENTATION_CHANGE, OnOrientationChange) // when the orientation is changed, run the function "OnOrientationChange"
ml.Bind(ml.EVT_MOTION, OnMotion) // when the portable device moves, run the function "OnMotion"
ml.MainLoop( ) // Begin an infinite loop, running the engine in the background.
Don't run any more of the program unless an event requires it.
def OnDoubleTap( ):
    [...If the double tap gesture is detected, perform the functions or operations listed here.]
def OnOrientationChange( ):
    [...If an orientation change is detected, perform the functions or operations listed here.]
def OnMotion( ):
    [...If movement is detected, perform the functions or operations listed here.]

Method 200 of FIG. 5 starts at 202, and in step 204, the application program initially sends commands to the API to provide settings that set up or "register" one or more algorithms (such as filters) to run in the background as "callback functions" during operation of the device 10. The settings can specify which types of information the application program wants during system operation. Such settings indicate to the API which algorithms should run and provide information (such as positions, orientations, notifications, etc.) back to the application program. For example, the application program may wish to be continually updated with the position and orientation of the device 10 as it is being moved around in space by the user. The application program can send settings to the API that will set up an algorithm to provide the desired information to the application program continually. In some embodiments the application program can optionally specify parameters to customize the high level information it will receive, such as setting the rate at which the application program will receive the information from the API, the amount of time during which such information will be sent to the application program, the number of times it should be notified, etc. In addition, the application program can send settings that indicate one or more conditions that cause information to be sent to the application program when those conditions are met as determined based on sensor data. For example, the settings can specify which particular motions or gestures will, when detected, trigger the API to notify the application program of their occurrence, or the amount of time required between two detected taps for it to be considered a "double tap" gesture. The application program may also specify the algorithms or filters which the data is to be processed with, or details such as specifying the integral of continuous motion and/or angle that the device is rotated through to cause a trigger.

In step 206, the application program receives information from the API based on the callback function algorithms that were requested to be run in the background, including high-level information. The API provides the desired information to the application program based on the operation of appropriate algorithms that were started based on the information of step 204 and are running in the background. Step 206 can be performed continuously, according to any requirements specified by the application program or inherent to the request as implemented by the API and lower layers. For example, in a camera application, the application program may need to continuously know if there is excess hand jitter on the camera, where the application program can issue warning signals to the user if such is the case. Step 206 may also be performed at irregular intervals, such as when conditions (as previously specified by the application program) are met. For example, the application program might need to issue output to the user if the device 10 is tilted too far in a certain direction, and would need to be notified of such a tilt. Step 206 may be performed during the performance of other steps of method 200.

In step 208, the application program checks whether it needs information to perform its execution, such information being based (at least in part) on sensor data read by motion sensors of the device 10. For example, the application program may need to know the current position of the device in response to a request for device location from the user. If no information is required in step 208, then the process returns to step 206 to receive information (if appropriate). If information is needed, then in step 210 the application program requests the needed high-level information from the API using a high-level command as defined by the API. In step 212, the application program receives the requested information from the API. The process then returns to step 206.

Figure 6:
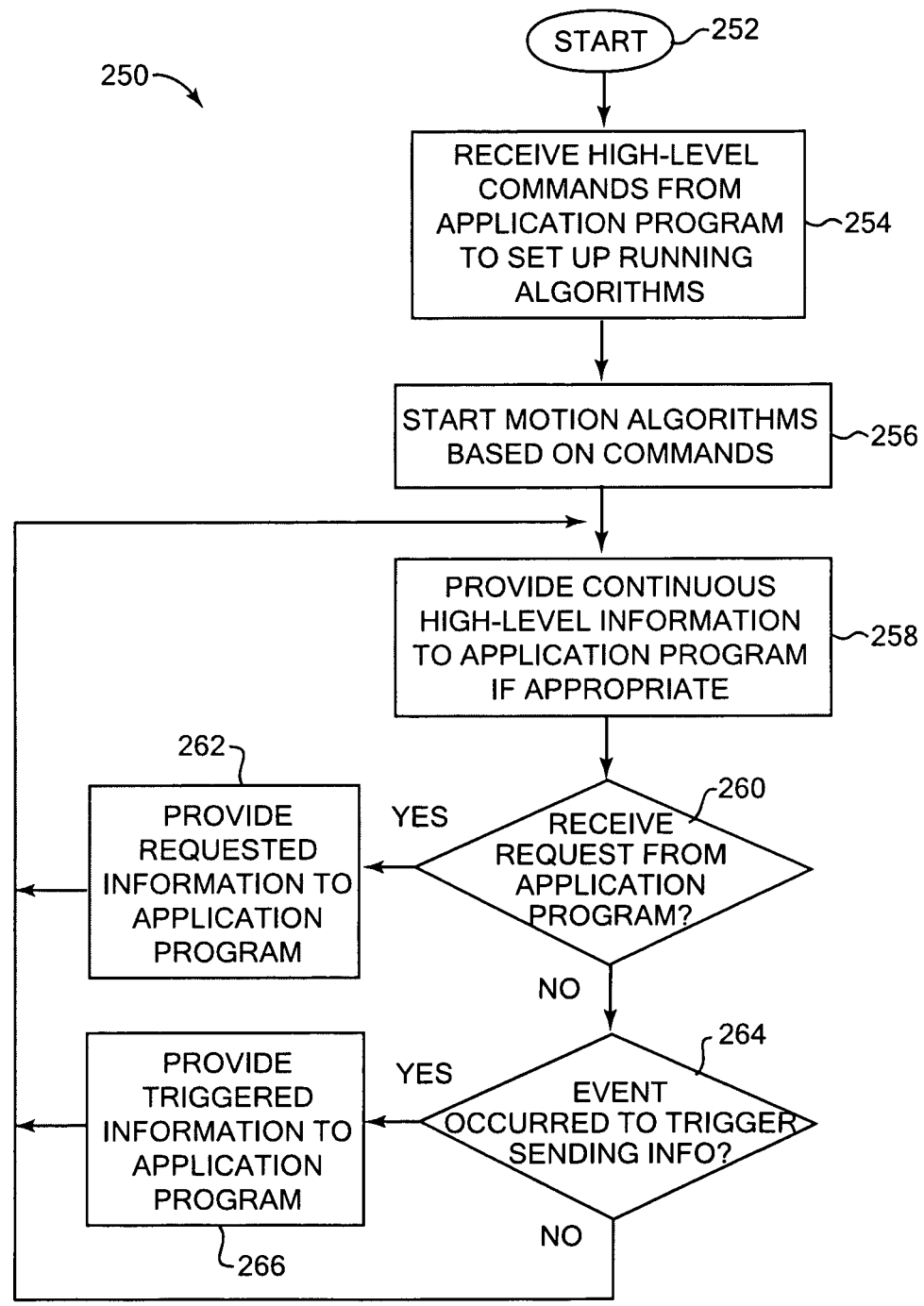
FIG. 6 is a flow diagram illustrating a method of the present invention of an API interfacing with other software layers implemented on the motion sensing device.

FIG. 6 is a flow diagram illustrating a method 250 of the present invention of an API interfacing with other software layers implemented on the motion sensing device 10. The process starts at 252, and in step 254, the API receives high-level commands from an application program to set up running algorithms. The high-level commands provide settings that indicate which high-level information the application program desires to receive from the running algorithms based (at least in part) on motion sensor data provided by the sensors of the device 10. As explained above with reference to FIG. 5, the settings may specify which types of information, the rate at which information is to be sent, conditions under which the information is to be sent, etc. The API translates the commands and settings from the application program into particular motion algorithms that will provide the requested information following the precise requirements of the associated application, e.g. by processing motion sensor data sampled from appropriate sensors at the required sampling rate for that application.

In step 256, the API starts the requested motion algorithms based on the received commands and settings, and these algorithms run in the background during operation of the device 10. The API can run the particular algorithms which satisfies the request and settings of the application program. In some embodiments, the command from the application program is high-level enough that it does not specify the particular algorithms to run in the background, and the API can associate the proper algorithms to the received commands. In alternate embodiments, the received commands can specify particular algorithms. The algorithms can sample and process sensor data at the precise timing required for the application and report derived information to the application program at the required timing of the application program. The algorithms can also check any conditions specified by the application program. In some embodiments, a higher software layer, such as in the API, can check for some or all such specified conditions.

In step 258, the API provides continuous information to the application program, if any such information was requested, which includes high-level information. For example, the API can receive processed information from one or more of the algorithms in motion algorithm layer 60, and provide this data to the application program. The API or algorithms preferably provide the information, or allow the application program to retrieve and sample the information, at a particular rate appropriate to the application implemented by the application program.

In step 260, the API checks to see if it receives a request from the application program for particular information. If not, step 264 is initiated, described below. If so, in step 262, the API provides the requested information to the application program. This information was obtained by querying the appropriate algorithm and receiving information from the algorithm. The process then returns to step 258. In step 264, the API checks to see if an event has occurred which triggers the sending of information to the application program. For example, the event can be one or more conditions as specified by the application program or API being met. If no event has occurred, the process returns to step 258. If an event has occurred, the API provides the triggered information (typically high-level information) to the application program in step 266. This information was obtained from the appropriate algorithm(s). The process then returns to step 258.

In some embodiments, the low-level processing of the motion algorithms includes intelligent processing particular to the type of application as indicated by the received high-level command and parameters or instructions sent by the API to the motion algorithms. A "Content Aware" API can thus be provided, which is intelligent enough to know what application(s) of the device 10 are currently running and enables key features associated with those applications accordingly. For example, if the current running application in use is a gaming application or navigation application, the API enables appropriate features related to gaming or navigation, respectively, including the appropriate sensors to read and timing requirements for reading those sensors, and the appropriate high-level information and functions to provide, including interface functions and outputs to the user.

For example, the low-level processing can include examining all of the outputs of all of the motion sensors of the motion sensing device to determine the high-level information needed for the type of application implemented by the application program. Depending on the type of application, the low-level processing can selectively use only a subset of the axes of the motion sensors needed for the type of application after examining all of the motion sensor outputs. For example, in a particular application running on a 6-axis device 10, an algorithm can examine all three gyroscopes and all three accelerometers to determine that the device 10 is either being held vertically in space, in which case only sensed data from the accelerometers are to be processed to create high level information for that application; or the device is being held horizontally in space, in which case only sensed data from the gyroscopes are to be processed for that application. In other embodiments, the high-level command received by the API can determine which axes and outputs of the motion sensors to selectively use in determining the high-level information, based on the type of application. In some embodiments, the high-level command need not specify the particular axes and outputs to use; rather, the low-level processing can know which sensor outputs to use based on what the particular high-level command is and the processing the API associates with that high-level command.

In some embodiments, the selective use of only some of the axes or outputs of the motion sensors can be further exploited by turning off the operation or sensing function of the motion sensors (or particular axes thereof) that are not being used for any currently-running application. This can save power consumption and/or processing bandwidth of the device 10.

Further power management features can also be included in the API layer, including a sleep mode and wake up mode, as well as overall power management for motion sensor resources. For example, the API layer can implement one or programs running on the application processor 12 or MPU 20 that turn off power to gyroscopes 26, which may consume more power than other sensors, any time they are not sensing any data, or if their sensed data is not in use. In one embodiment, the gyroscopes can be "woken up" as soon as some motion of the device 10 is sensed by other motion sensors.

Figure 7:
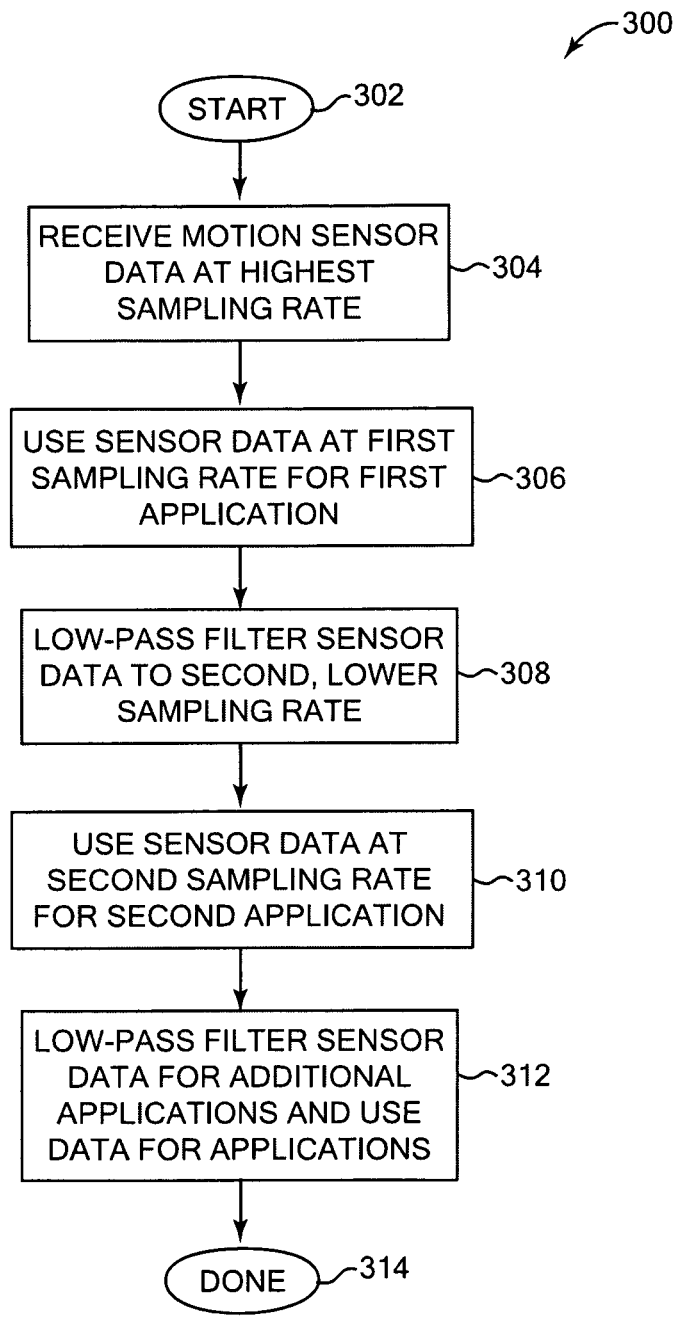
FIG. 7 is a flow diagram illustrating a method of the present invention for simultaneously processing data for different applications concurrently running on the motion sensor device.

Examples of API commands which can be used with an API according to the present invention are provided below.
mlInitializeSensors( )
mlGetRawData( )
mlGetCalibratedData( )
mlGetAugmentedData( )
mlGetHumanMotion( )
mlGetRotationMatrix( )
mlGetQuaternion( )
mlGetRoll
mlGetPitch( )
mlGetYaw( )
mlHeading( )
mlGetLocation( )
mlGetPSF( )
mlGetBlurAmount( )
mlCalibrate( )
mlUpdateState( )
mlUpdateRotationMatrix( )
mlUpdateHumanMotion( )
mlUpdateGesture( )
mlRegisterGestures( )
mlGestureCallBack( )
mlUpdateKalmanFilter( )
mlUpdateSensorCalibration( )
mlSetNoiseMatrix( )
mlSetProcessMatrix( )
mlGeneratePSF( )
mlBlendImages( )
mlEvaluateImage( )
Processing of Simultaneous Multiple Applications FIG. 7 is a flow diagram illustrating a method 300 of the present invention for simultaneously processing data for different applications simultaneously running (i.e., being simultaneously implemented) on the motion sensor device 10, by one or more concurrently-running application programs. The method 300 assumes that multiple applications are concurrently running and require motion sensor data or data derived from the motion sensor data. In some embodiments, the method 300 can be implemented by the motion algorithm layer 60.

At least two of the concurrently-running applications require motion sensor data to be sampled at different minimum sampling rates. For example, an image stabilization application requires motion sensor data to be sampled at a high rate, such as 500 Hz, while a user interface application may require motion sensor data to be sampled at a lower rate, such as 50 Hz.

The process starts at 302, and in step 304, sensor data is received at a first sampling rate. The first sampling rate is determined as the highest minimum sampling rate required by any application currently running on the device 10 (a sampling rate greater than the minimum required can also be used). The sampling rates of other application programs that are available on the system 10, but are not currently running, are not relevant to the determination of this first sampling rate. In step 306, the sensor data sampled at the first (highest) sampling rate is used for a first application running on the device 10 (or used for multiple first applications, if more than one application requires data to be minimally sampled at the first sampling rate). As described above, motion algorithms in layer 60 can process the sensor data and provide processed high-level information to the API and a first application program implementing the first application.

In step 308, a low-pass filter is used on the sensor data received in step 304 at the first sampling rate to achieve a lower, second sampling rate that is appropriate for a different, second application concurrently running on the device 10, but which is too low of a rate to be used for the first application(s). For example, the second application may only need sensor data sampled at a lower rate than the first application, such that the first sampling rate can be reduced using the filter. The low pass filter of step 308 can be any of a variety of different types, such as a point running average, an infinite impulse response (IIR) filter, a finite impulse response (FIR) filter, etc. In step 310, the sensor data sampled at the second sampling rate is used for the second application (or used for multiple applications, if more than one can use sensor data at the second sampling rate). Steps 310 and 306 can performed simultaneously to the other steps of the method 300.

If additional applications are currently running and can use data at a different sampling rate, then in step 312, a low-pass filter is similarly used on the filtered sensor data to achieve even lower sampling rates for additional applications currently running, if appropriate, and the sampled data is used for those additional applications. If such applications are running, the second sampling rate of step 308 is the second-highest sampling rate required by any application program currently running, and the sampling rates of step 312 are lower than the second sampling rate of step 308. For example, if two additional applications can use different, lower sampling rates, then the data provided at the second sampling rate is filtered to provide a third sampling rate for the appropriate one of the applications, and the data at the third sampling rate is filtered to provide a fourth, lower sampling rate for the other application. The process is then complete at 314.

Method 300 thus allows different applications with different sampling rate requirements to be executed simultaneously on a device 10, which is normally a difficult task, by low-pass-filtering the data in a tree format. For example, a blur calculation may require sensor data to be sampled at 500 Hz, a user interface application may require a sampling rate of 100 Hz, and a navigation application may require a sampling rate of 20 Hz. At the application program level, the user interface display may be updated at 10 Hz, while the navigation data is merged with GPS data at 1 Hz. A motion sensing engine simultaneously running these applications must be able to receive motion sensor data at different sampling rates simultaneously in order to process sensor data for the multiple applications simultaneously. For example, a user may want to take a picture without blur, while controlling the camera user interface with motion gestures. Simultaneously, the device can be dead reckoning, so that the location of the device is not lost during the camera application. For a GPS-enabled camera-phone, a user may not want to lose his or her location each time a picture is taken.

The filtering in the tree format described in method 300 allows different sampling rates to be extracted from a single highest sampling rate. For example, raw sensor data can be sampled at 500 Hz with a 250 Hz anti-aliasing filter for electronic image stabilization. A 10 point running average (e.g., one type of low pass filter that can be used) of step 308 provides more anti-aliasing, reducing the bandwidth from 500 Hz to 50 Hz, allowing a 100 Hz sampling rate for a user interface application (an application can be allowed a sampling rate up to double the sensor sampling rate). Another 10 point running average can be used at 100 Hz, providing a 10 Hz bandwidth suitable for a 20 Hz navigation filter. The outputs of all these filters can be updated at their respective sample rates, without the user's knowledge. This minimizes the application processor time, since only the image stabilization filter needs to be run at the highest sample rates.

In another example, an image stabilization application can be combined with a user interface application. Either raw accelerometer data or augmented data (in this example, gravitational acceleration derived from sensor data from both accelerometers 28 and gyroscopes 26) can be used to track the orientation of the camera, used for image rotation (portrait or landscape) and leveling information. Simultaneously, gestures can also be input by the user to control camera modes, such as, for example, switching from still camera mode to video camera mode. Using the present invention, the high-sample-rate gyroscope sensor data used for blur data is captured at the same time as the lower-sample-rate gyroscope sensor data used for gesture recognition data.

In yet another example, navigation can be combined with a user interface application. In addition to running a dead reckoning algorithm for a navigation application, a handheld device may also be required to run a map rotation algorithm and a user input algorithm for a user interface application. Using the present invention, these algorithms can be running simultaneously at different sample rates, since the map rotation requires low latency in order to be an effective user interface, but the navigation algorithm may only be required to run at 20 Hz.

The different sampling rates provided by the present invention can also be used for power management of the device 10. In some embodiments, power consumption of the device 10 can be reduced, which can be important for handheld and portable applications such as pedestrian navigation. For example, in a navigation application, a GPS unit (not shown) can be an additional unit connected to the device 10 to determine the location of the device. A dead reckoning algorithm in layer 60, used in combination with a GPS receiver, can more accurately determine current location than if the GPS receiver were solely used to determine location. The dead reckoning filter has the additional benefit that it can reduce the processing required by the GPS unit, thus reducing power. If using dead reckoning with GPS location detection, a 1 Hz GPS sample rate may be reduced to 0.1 Hz, or the satellite tracker may track only 3 satellites instead of 12 satellites. Any inaccuracies in the GPS algorithm can be offset by the additional information achieved by the dead reckoning algorithms.

Hardware and Software Buffering

One reason that hardware, such as the MPU 20, is used in device 10 is to reduce the processing burden on the application processor 12 and/or other processors of the device 10. Using only software for capturing motion sensor data can be inefficient due to processor/CPU overhead, timing constraints, and difficulty for coding or customization and portability. Ideally a motion sensing driver should use no more than 1% of the CPU time, and guaranteeing correct timing may be difficult within a mobile device operating system. However, hardware is not used to perform all sensor functions for several reasons, including increased cost, and inaccurate and limited features. For example, adding extra hardware processing to the sensor integrated circuit increases the die area, which may be unnecessary if that same processing can be performed in software on the application processor 12.

Often the precise timing necessary for motion sensing is required for the input of data to an algorithm, but not the output to a user, i.e., the timing requirements are more relaxed for the output of an application program to the user. For example, in a user interface application, the motion sensing is often performed at 100 Hz, with precise timing to capture all the necessary motion. However, the output to the user by the application program may only be at 10 Hz, with imprecise timing.

Embodiments of the present invention can use hardware and/or software to take advantage of relaxed timing constraints for the application program output and thereby reduce processing time of the application processor. Some embodiments can provide more processing with software for those systems having a fast processor, while other embodiments can provide more processing with hardware for systems with a slower processor or other processing burdens. In any embodiment, the same API layer 56 can be used to provide resulting high-level information to application programs, allowing maximum portability to any system.

Figure 8A:
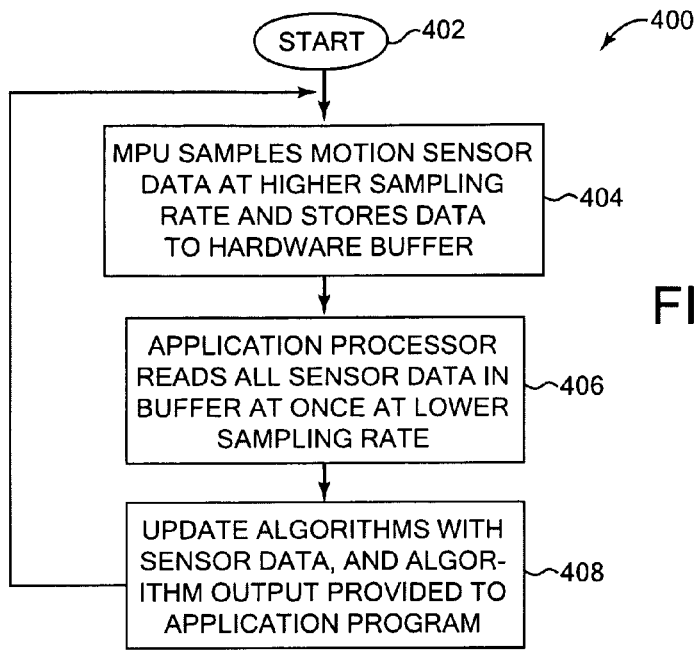
FIGS. 8A-8D are flow diagrams illustrating methods of the present invention for providing buffering to reduce processing of the application processor in receiving motion sensor output.

FIG. 8A is a flow diagram illustrating a first method 400 of the present invention for providing buffering to reduce processing of the application processor in receiving motion sensor output. Method 400 uses hardware buffering to allow the application processor 12 to relax its timing constraints in obtaining sensor data.

The method starts at 402, and in step 404 the MPU 20 samples motion sensor data at a higher rate and records the sensor data to a hardware buffer. For example, the hardware buffer can be in the hardware processing block 30 of the MPU 20 as shown in FIG. 1, or in different connected hardware of the device 10. The MPU samples the sensor data at the high rate and precise timing normally required to capture motion data for a particular application.

In step 406, the application processor 12 reads all sensor data accumulated in the hardware buffer since the last time it read the buffer, where the processor 12 samples the hardware buffer (and sensor data) at a lower rate than the MPU used to record the sensor data. The processor reads all these sensor data points in the hardware buffer at once.

In step 408, the motion algorithms are updated in quick succession based on the retrieved multiple sensor data points, and the final output of the algorithms is provided to the application program at the lower sampling rate. This provides information to the application program at the lower required sampling rate. The process then returns to step 404.

The accumulation of sensor data in the buffer allows application programs of application processor 12 to relax timing constraints for sampling data from the MPU without missing any motion information. For example, the MPU hardware may record sensor data in the buffer at the higher rate of 100 Hz. An application program on application processor 12 may need to update a display screen based on motion at only a 10 Hz sample rate. Using the method 400, the motion algorithms can read all the data stored in the MPU buffer at once at a rate of 10 Hz. Thus, if 10 data points are in the buffer, the motion algorithms are updated 10 times in quick succession, and the display information output by the motion algorithms is provided to the application program, effectively at 10 Hz. This allows the application processor 12 to read the buffer only when it needs to, e.g., at a rate of 10 Hz (the display refresh rate), which reduces the total processing time of the processor 12. The reduction may not be by a large amount, since the motion algorithms are still being run at the higher rate on average using all data points of the received motion data.

Figure 8B:
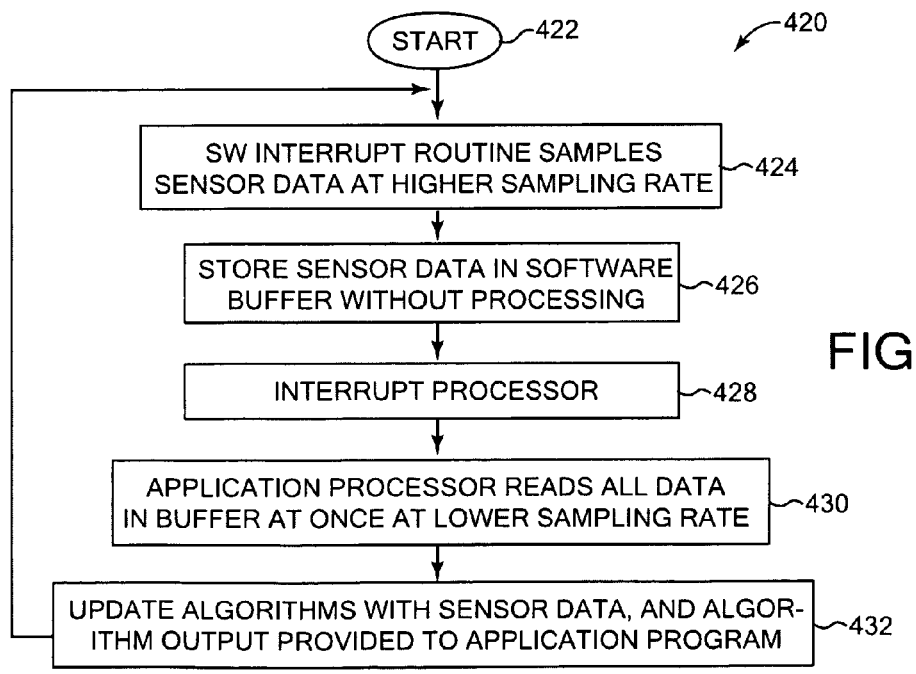

FIG. 8B is a flow diagram illustrating a second method 420 of the present invention for providing buffering to reduce processing of the application processor in receiving motion sensor output. Method 420 uses software buffering to allow the application processor 12 to relax its timing constraints in obtaining sensor data.

The method starts at 422, and in step 424 an interrupt routine samples motion sensor data at a higher rate. The interrupt routine is a software routine running on the application processor 12 and can be provided in the algorithm layer 60, for example. The interrupt routine samples the sensor data from the MPU 20 at the high rate and with the accurate and precise timing normally required to capture motion data appropriate for an application. In step 426, the interrupt routine stores the data read in step 424 in a software buffer, without processing the data. For example, the software buffer is memory accessible to the application processor and can be provided in the application processor 12 (registers, RAM, etc.), in the memory 14 of the device 10, or in other available memory.

In step 428, the interrupt routine interrupts the processor 12 to indicate that enough sensor data is accumulated to be read. In step 430, the application processor 12 (e.g., a motion algorithm) reads all the sensor data accumulated in the software buffer since the last time it read the buffer. Thus, the processor 12 reads the sensor data at a lower rate than the interrupt routine used to sample and store the sensor data. In step 432, the motion algorithms are updated in quick succession based on the retrieved multiple sensor data points, and the final output of the algorithms is provided to the application program at the lower sampling rate. This provides information to the application program at the lower required sampling rate. The process then returns to step 424.

As with the hardware buffer embodiment of FIG. 8A, the accumulation of sensor data in the buffer allows the application processor 12 to relax its timing constraints with regard to the application program output without missing any motion information. For example, the interrupt routine may sample and store sensor data in the buffer at the higher rate of 100 Hz, but the application processor 12 can read all the data stored in the software buffer at once at a relaxed rate. Thus, at a sample rate of 10 Hz, the application processor can retrieve the latest 10 data points in the buffer and process the motion algorithm 10 times in quick succession, allowing a display application program to receive appropriate information from the algorithms at 10 Hz and provide its output at 10 Hz.

Figure 8C:
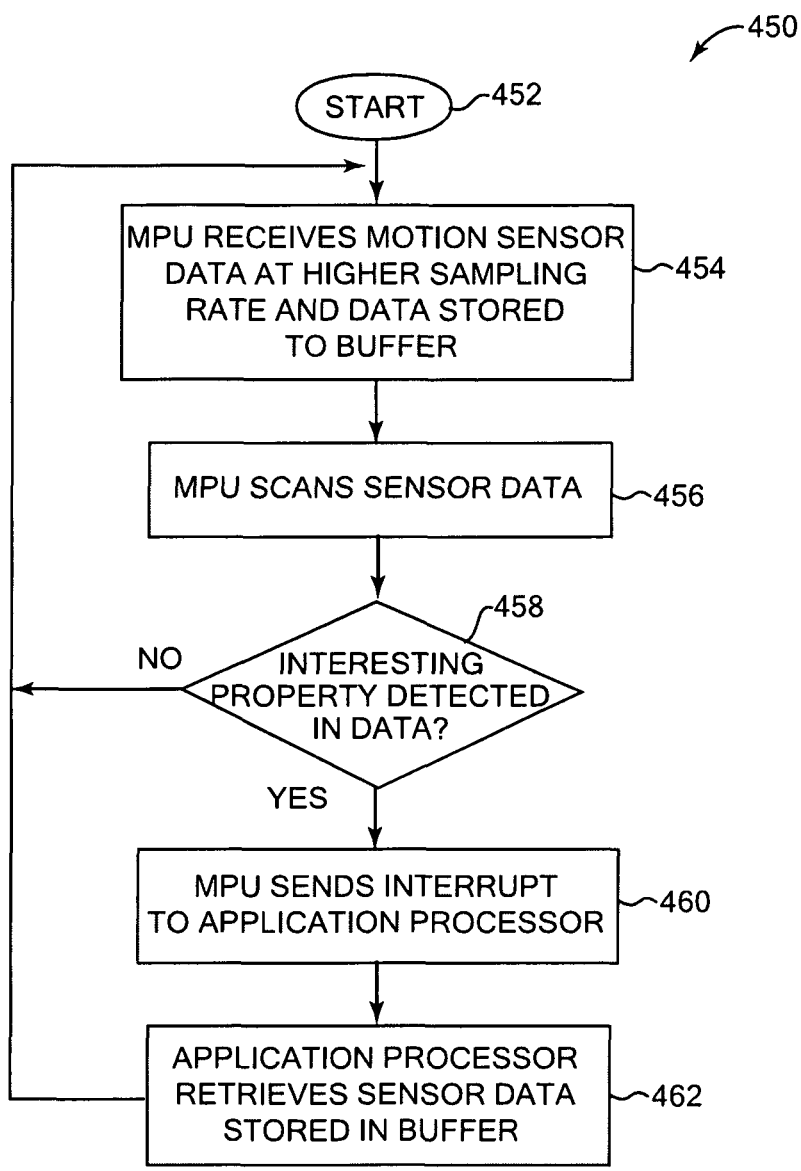

FIG. 8C is a flow diagram illustrating a third method 450 of the present invention for providing buffering to reduce processing of the application processor in receiving motion sensor output. Method 450 uses hardware interrupts to allow the application processor 12 to reduce its timing constraints in obtaining sensor data.

The method starts at 452, and in step 454 the MPU 20 receives the sensor data, and the sensor data is stored in a buffer. This sampling is performed at a high rate and with the accurate and precise timing normally required to capture motion sensor data. The sensor data can be stored in a hardware buffer or in a software buffer.

In step 456, the MPU scans the buffered sensor data. In step 458, the MPU checks whether any "interesting" properties have been detected in the scanned sensor data. Such properties are patterns or features in the data that may be relevant to a particular algorithm or application, such that they should be reported to the application processor 12. For example, the properties can include a predetermined threshold that has been exceeded, or a pattern in the data indicating a particular type of motion. For example, when a gesture is made by the user, thresholds may be exceeded on at least one motion sensor. Or a particular threshold value may have been exceeded indicating a level of jitter on the camera lens portion of device 10. If no interesting properties are detected by the MPU in step 458, then the process returns to step 454.

If one or more interesting properties is detected, then in step 460 the MPU sends an interrupt to the application processor. This interrupt indicates to the application processor that an interesting property has been detected and should be examined by the application processor. Thus, in step 462, the application processor 12 retrieves data stored in a buffer that includes the detected interesting properties, e.g., the MPU can buffer the interesting property data in a different buffer or other area of the buffer, which the processor 12 can read from, or the MPU can designate the location to read from in the main buffer. The application processor 12 then analyzes the retrieved data as appropriate to the application, e.g., process the data with an algorithm in the algorithm layer 60 and provide the data via the API 56 to the application program at a reduced sampling rate. The process then returns to step 454.

The use of the MPU hardware to check for particular properties in the sensed data can reduce the processing overhead of the application processor. Even if the MPU sends interrupts to the application processor at a high rate, such as detecting interesting properties five times per second, it still reduces the number of times the algorithm processing and application program processing must be run from 100 Hz to 5 Hz. With this embodiment, the timing constraints have been reduced for all software on the application processor 12, and the processing time of processor 12 has thus also been reduced.

Figure 8D:
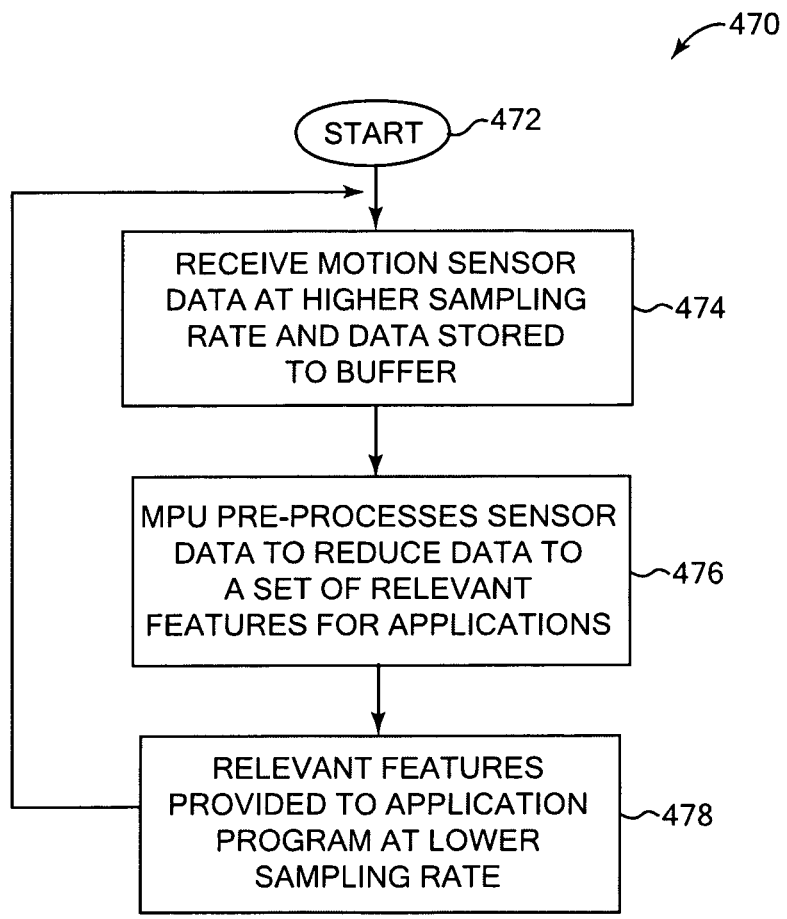

FIG. 8D is a flow diagram illustrating a fourth method 470 of the present invention for providing buffering to reduce processing of the application processor in receiving motion sensor output. Method 470 uses a more advanced method of hardware pre-processing to allow the application processor 12 to reduce its timing constraints in obtaining sensor data.

The method starts at 472, and in step 474 the MPU 20 receives the sensor data, and the sensor data is stored in a buffer, such as the hardware buffer of the MPU. The data is sampled and stored at a high rate and with the precise timing normally required to capture motion sensor data. In step 476, the MPU pre-processes the sensor data to reduce the data to a set of relevant features for one or more applications. The MPU can include motion algorithms similar to, or a subset of, the motion algorithms present in the motion algorithm layer 60 of the application processor software. For example, in some embodiments the MPU can detect particular gestures by processing the sensor data. This processing ability can determine which features are relevant to the applications running on the application processor 12, and/or provide high-level information for an application program. For example, relevant features can be parameters calculated from additional derivatives and integrals of the inertial data.

In step 478, the set of relevant features is provided to the application program on the application processor 12, at a lower sampling rate than the sampling rate used to capture the motion sensor data. Thus, for example, a 100 Hz sample rate for capturing sensor data can be reduced to a 5 Hz sample rate providing only the relevant information to the application processor. The relevant features can then be provided to the application program at the reduced sampling rate (or to an appropriate motion algorithm for further processing, which provides information to the application program at the reduced sampling rate). Similar to the embodiment of FIG. 8C, with this embodiment, the timing constraints have been reduced for all software on the application processor 12, and the processing time of processor 12 has thus also been reduced.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing motion sensor data from motion sensors on a motion sensing device to an application program running on the motion sensing device, the method comprising:
    sampling motion sensor data output by the motion sensors at a first sampling rate, wherein the motion sensors include a plurality of gyroscopes and a plurality of linear motion sensors; wherein the plurality of gyroscopes detect motion and orientation of the motion sensing device itself;
    storing the motion sensor data in a buffer; and
    providing an application interface (API) layer which is in communication with the application program, wherein the application program initially sends commands to the API layer to provide settings that set up one or more motion algorithms to run in the background, wherein the settings specify which types of information related to the buffered motion sensor data the application program wants during system operation, wherein the settings indicate to the API layer which of the one or more motion algorithms should run and which of the one or more motion algorithms provide information back to the application program about the device.

2. The method of claim 1 wherein the requirements of a type of application include a precise sampling rate for the motion sensor data obtained from the motion sensors.

3. The method of claim 1 wherein the motion sensor data is obtained from the motion sensors at a precise sampling rate following a requirement of the application, and wherein at least two of the plurality of different types of applications available for use on the motion sensing device have different sampling rate requirements for the motion sensor data.

4. The method of claim 1 which includes providing high-level information to the application program, wherein providing the high level information includes providing the high-level information such that it is received by the application program at a sampling rate appropriate to the type of the application implemented by the application program.

5. The method of claim 1 wherein high-level information is received by the application program at a sampling rate lower than the sampling rate used to sample the motion sensor data.

6. The method of claim 1 wherein a plurality of different application programs that implement different types of applications available for use on the motion sensing device run simultaneously on the motion sensing device.

7. The method of claim 6 wherein the plurality of different application programs require high-level information to be provided at different sampling rates from each other, and wherein the sampling rate of the motion sensor data for one of the applications is obtained by filtering the sampling rate of the motion sensor data for a different one of the applications.

8. The method of claim 1 wherein a plurality of different types of applications available for use on the motion sensing device include at least one of a motion sensing application, an image stabilization application, and a navigation application.

9. The method of claim 1 wherein the processing of the motion sensor data includes running one or more motion algorithms in the background during the operation of the motion sensing device, the motion algorithms checking the motion sensor data for one or more conditions to be met, which causes the application program to be notified.

10. The method of claim 1 further comprising buffering the motion sensor data obtained at a higher sampling rate and with precise timing requirements, and processing the buffered motion sensor data and providing the buffered motion sensor data to the application program at a lower sampling rate and relaxed timing requirements.

11. The method of claim 1 wherein the plurality of gyroscopes include three gyroscopes, and wherein the plurality of linear motion sensors include three accelerometers, the three gyroscopes and the three accelerometers providing 6-axis sensing.

12. The method of claim 1 wherein high level information is determined from additional sensors of the motion sensing device, the additional sensors including at least one of a temperature sensor, a pressure sensor, and a compass.

13. The method of claim 1 wherein low-level processing includes examining all the outputs of all of the motion sensors of the motion sensing device to determine high-level information.

14. The method of claim 13 wherein the low-level processing determines to selectively use only a subset of the axes of the motion sensors for a type of application after examining all outputs of the motion sensors.

15. The method of claim 14 wherein low-level processing turns off the operation of motion sensors not used for the type of application to save power consumption or processing bandwidth.

16. The method of claim 1 wherein the low-level processing determines which outputs of the motion sensors to selectively use in determining the high-level information, based on the particular high-level command.

17. The method of claim 1 wherein low-level processing is performed at least in part by a motion processing unit distinct from and in communication with an application processor of the motion sensing device.

18. The method of claim 1 wherein the buffer is a hardware buffer implemented in a motion processing unit separate from an application processor.

19. The method of claim 1 wherein the buffer is a software buffer implemented in memory, and wherein an interrupt routine samples the motion sensor data and interrupts an application processor running the application program to retrieve at least a portion of the buffered motion sensor data.

20. The method of claim 1 wherein a motion processing unit separate from an application processor scans the stored motion sensor data to detect properties relevant to the application program.

21. The method of claim 1 wherein a motion processing unit separate from an application processor reduces the motion sensor data in the buffer to a set of features relevant to the application program, and wherein the retrieved portion of the buffered motion sensor data is the set of features.

22. A motion sensing device including an interface for one or more application programs provided on the motion sensing device, the motion sensing device comprising:
- a motion processing unit including a plurality of motion sensors for sensing the motion of the motion sensing device, the motion sensors including at least one gyroscope and at least one linear motion sensor; wherein the at least one gyroscope detects motion and orientation of the motion sensing device itself; and
- an application processor coupled to the motion processing unit, the application processor providing an application program that implements one of a plurality of different types of applications available for use on the motion sensing device, and
- an application interface (API) layer which is in communication with the application program, wherein the application program initially sends commands to the API layer to provide settings that set up one or more motion algorithms to run in the background, wherein the settings specify which types of information related to the buffered motion sensor data the application program wants during system operation, wherein the settings indicate to the API layer which of the one or more motion algorithms should run and which of the one or more motion algorithms provide information back to the application program about the device.

23. The method of claim 1, wherein the information back to the application program includes any or any combination of positions, orientation, notifications for the device.

24. The motion sensing device of claim 22, wherein the information back to the application program includes any or any combination of positions, orientation, notifications for the device.

25. The method of claim 1, wherein at least one other analog sensor provides sensor data to the application program.

26. The method of claim 1, wherein at least one other sensor provides sensor data, the at least one other sensor includes any and any combination of a compass sensor and a barometer sensor.

27. The motion sensing device of claim 22, wherein at least one other analog sensor provides sensor data to the application program.

28. The motion sensing device of claim 22, wherein at least one other sensor provides sensor data, the at least one other sensor includes any and any combination of a compass sensor and a barometer sensor.

* * * * *